United States Patent
Yutaka et al.

[19]

[11] Patent Number: 6,135,699
[45] Date of Patent: Oct. 24, 2000

[54] IC TRANSPORTING APPARATUS, IC POSTURE ALTERING APPARATUS AND IC TAKE-OUT APPARATUS

[75] Inventors: Watanabe Yutaka, Kumagaya; Okuda Hiroshi, Tatebayashi; Yamashita Kazuyuki, Kasukabe; Sagawa Makoto, Gunma; Nakajima Haruki, Hanyu; Kawano Shigenori, Gyoda, all of Japan

[73] Assignee: Advantest Corporation, Tokyo, Japan

[21] Appl. No.: 09/382,208

[22] Filed: Aug. 23, 1999

Related U.S. Application Data

[62] Division of application No. 08/860,600, filed as application No. PCT/JP95/02393, Nov. 24, 1995, abandoned.

[30] Foreign Application Priority Data

Nov. 6, 1995 [JP] Japan .................................. 7-287655

[51] Int. Cl.[7] .................................................. B65G 59/06
[52] U.S. Cl. ...................... 414/421; 414/416; 414/798.9; 414/414; 324/158.1; 29/743
[58] Field of Search .................................. 414/737, 728, 414/403, 404, 413, 414, 416, 421, 425, 411, 417, 742, 798.9; 324/532, 158.1; 29/829, 743; 269/329

[56] References Cited

U.S. PATENT DOCUMENTS

| | | |
|---|---|---|
| 4,760,924 | 8/1988 | Sato et al. . |
| 5,190,431 | 3/1993 | Klugetal .................................. 414/417 |
| 5,326,218 | 7/1994 | Fallas . |
| 5,772,387 | 6/1998 | Nakamura et al. . |

FOREIGN PATENT DOCUMENTS

| | | |
|---|---|---|
| 58-97900 | 6/1983 | Japan . |
| 61-217775 | 3/1986 | Japan . |
| 62-56874 | 3/1987 | Japan . |
| 1-131469 | 2/1989 | Japan . |
| 64-42475 | 3/1989 | Japan . |
| 3-97676 | 10/1991 | Japan . |
| 5-12917 | 2/1993 | Japan . |

*Primary Examiner*—Frank E. Werner
*Attorney, Agent, or Firm*—Staas & Halsey LLP

[57] ABSTRACT

A semiconductor device transporting apparatus and a semiconductor device posture altering apparatus are provided which constitute a portion of a semiconductor device transporting and handling apparatus used in a semiconductor device testing apparatus of magazine/tray combination type. The semiconductor device transporting apparatus and the semiconductor device posture altering apparatus are used for loading onto a test tray in the horizontal posture semiconductor devices from a magazine supported in an inclined posture by which semiconductor devices can run out therefrom by their own weights. The posture of the semiconductor device in the inclined state discharged from the magazine is altered to horizontal posture by using either one of a posture altering rail having a slope gradually reduced to horizontal at the end of the rail, a movable rail horizontally rotated after having received the semiconductor device in the inclined posture thereby altering the posture of the semiconductor device to horizontal posture, and a rotary arm rotated by 180° after having received the semiconductor device in the inclined posture thereby altering the posture of the semiconductor device to horizontal posture.

3 Claims, 15 Drawing Sheets

IC TRANSPORTING APPARATUS, IC POSTURE ALTERING APPARATUS AND IC TAKE-OUT APPARATUS

This application is a Divisional of application Ser. No. 08/860,600, filed Jul. 1, 1997, now abandoned, which is a 371 of PCT/JP95/02393, filed Nov. 24, 1995, which claims priority under 35 U.S.C. §119 to JP 287655/95, filed Nov. 6, 1995 in JAPAN.

BACKGROUND OF THE INVENTION

1. Field of the Invention

The present invention generally relates to a semiconductor device transporting and handling apparatus (commonly called IC handler) adapted to be used, in an IC testing apparatus (commonly called IC tester) for testing semiconductor devices, particularly, ICs (semiconductor integrated circuits) which are typical of the semiconductor devices, for transporting ICs for testing and sorting out and handling the tested ICs. More particularly, the present invention relates to an IC transporting apparatus, and to an IC posture altering or changing apparatus for altering the posture or position of an IC to an another posture or position (usually horizontal posture) used in transporting ICs to be tested (commonly called DUT) to a test or testing section in the IC tester, and also relates to an IC take-out apparatus used in taking out ICs from a magazine.

2. Background of the Related Art

In the early stage of ICs practically used, most ICs were what is called dual-in-line package (DIP) type wherein terminals of an IC housed in the package project from the longer opposite sides of the package which is of rectangular shape in plan and are bent downwardly substantially at right angle such that the whole configuration in section of the IC is of substantially angular "U" letter shape. For this reason, as an IC container for accommodating such ICs was used a square-shaped pipe-like IC container which is of substantially rectangular shape in section called a "rod-like magazine". Therefore, the IC transporting apparatus for transporting ICs to be tested to the testing section is so constructed that it can support the rod-like magazine in an inclined state from its horizontal state. In such IC transporting apparatus, the rod-like magazine is held on the inclined state on transporting ICs accommodated in the magazine so that the ICs are successively slid down by their own weights. That is, a procedure for transporting ICs utilizing the natural dropping force of each IC by its own weight has been taken.

However, because of the increased number of terminals due to the improved integration degree of an IC and of various kinds of terminal structures, it has been difficult to smoothly transport by utilizing the natural dropping procedure. For this reason, in recent trend, most IC handlers tend to adopt a horizontal transporting system. The IC handler of horizontal transporting system is such that ICs are received in a platter-like tray from which each IC is attracted by a pick-up head by the action of vacuum suction, and then the pick-up head is moved in X–Y direction by horizontal transporting means to transport each IC to a testing section of an IC tester provided within the IC handler.

By adopting the horizontal transporting system, an IC package of any shape could be easily transported regardless of the terminal structure of the IC package if the IC package is formed in flat shape so that it can be easily attracted by a pick-up means using the action of vacuum suction, even if the IC package has a structure that terminals are led out from the four sides thereof such as QFP. That is, a highly generalized IC handler can be constructed.

In case an IC handler of horizontal transporting system is practically operated, all ICs are handled in the state that they are received in a tray. That is, even in the outside of the apparatus, ICs are circulated and stored in the state that received in a tray for user (customer tray). Since the upper surface of the tray is open, ICs are easy to drop from the tray, and thus the handling of the tray is cumbersome.

On the other hand, since a rod-like magazine is a square-shaped tube, dropping of ICs can easily be prevented by closing both ends of the magazine. Therefore, a rod-like magazine is easier to handle in the stage of circulation. Accordingly, it is proper and safe to handle ICs in the state received in a magazine as much as possible in case the ICs have shapes that can be accommodated in the magazine.

In view of such background, as proposed in Japanese Patent Application No. 171911/1994 (Hei 6-171911), an IC handler of horizontal transporting system is recently beginning to be practically used, which can transport and handle, for testing, both of ICs received in a magazine and in a tray. In the IC handler of horizontal transporting system, since horizontal transporting means must be used within the IC handler, in order to construct the IC handler which is capable of transporting and testing both of ICs received in a magazine and in a tray, transfer or transshipment means must be provided in the IC handler for transshipping the ICs received in the magazine to a tray.

It is a general practice for taking out ICs from a magazine to incline the magazine so that the ICs received therein can run out of the magazine. Then the ICs taken out from the magazine are transferred to a tray. Therefore, it is necessary to transfer the ICs in an inclined position or posture to the tray in horizontal position or posture, and this alteration of posture of the ICs produces a great problem.

FIG. 15 shows an construction of a magazine-tray transfer section for transferring ICs from a magazine to a tray, i.e., a position or posture of IC altering section used in a previously proposed IC handler of horizontal transporting system which can be used in common for both magazine and tray.

In case of testing ICs received in the tray, a user tray 21 loaded with ICs to be tested is conveyed from a tray supply section 20 to a tray changing section 30 where the ICs are transferred from the user tray 21 to a test tray 31. This transfer or transshipment of the ICs are performed by horizontal transporting means 40. That is, the horizontal transporting means 40 has a pick-up head 41 attracting an IC by the action of vacuum suction (hereinafter referred to as "vacuum suction head") and transfers the ICs from the user tray 21 onto the test tray 31 by moving the vacuum suction head 41 up and down by means of an air cylinder 42 as well as moving the vacuum suction head 41 to an arbitrary position in horizontal plane by means of X–Y drive means (not shown).

Here, the reason why the ICs are transferred from the user tray 21 to the test tray 31 will be briefly explained. The user tray 21 is one which is used for accommodating ICs therein and for circulating the ICs loaded therein within a factory or plant or a market. For this end, the user tray 21 is made of a plastic material or the like, and the shape of each of recessed portions for receiving the ICs is formed larger in size than that of an IC to be received so that the ICs can be easily taken in and out of the recessed portions.

On the other hand, since ICs to be tested are applied a thermal stress of high temperature or low temperature on the path to the testing section 10 of the IC tester, the test tray 31 is made of a material that can be proof against the thermal stress. In general, the test tray 31 is constructed such that 16 to 64 IC carriers each of which has a recessed portion for receiving an IC are mounted on a metal frame. Each of the IC carriers is made of a thermal-resistant resin material, and has a mechanism added thereto for accurately positioning, holding and locking an IC to be tested once the IC is inserted into the IC carrier, and a function added thereto for exposing the terminals of the locked IC to the back side of the IC carrier and contacting the exposed terminals with the contacts for testing connected to the IC tester in the testing section 10, and the like.

As mentioned above, since the test tray 31 must have various functions, the ICs to be tested are transferred from the user tray 21 to the test tray 31. Further, the reference numeral 22 denotes tray transporting means for taking out a user tray 21 from the tray supply section 20 and for transporting the user tray 21 to the tray changing section 30.

The reference numeral 50 denotes a magazine supply section. A plurality of rod-like magazines 51 are stored in the magazine supply section 50 stacked one on another. The uppermost magazine 51 of the stacked magazines stored in the magazine supply section 50 is taken out and is placed on elevator means 52. The elevator means 52 which is rotatably supported functions to lift up one end of the magazine 51 placed on the elevator means 52 (right hand side in the example shown in FIG. 15) by the rotating operation thereof and to hold the magazine 51 in the inclined posture. At the lower end portion of the elevator means 52 in the inclined state thereof shown is provided a movable stopper 52A which is used to prevent the ICs to be run out from the magazine 51 until the magazine 51 is rotated and stopped at the predetermined inclined position. When the magazine 51 is set to the predetermined inclined position and is connected to a buffer rail 53 provided at an appropriate downstream position of the magazine 51, the movable stopper 52A is released (pulled down) so that the ICs are run out on the buffer rail 53 from the magazine 51.

An another movable stopper 53A is provided at the lower end portion of the buffer rail 53 in the inclined state. This movable stopper 53A operates to hold the IC positioned at the lowermost of the buffer rail 53. An escape rail 54 movable in the direction (lateral direction) orthogonal to the direction of movement of IC is provided at the downstream side of the buffer rail 53. On the escape rail 54 are provided, for example, four grooves substantially in parallel and juxtaposed with one another for receiving ICs. Each time an IC is received in one of the grooves, the escape rail 54 moves in the lateral direction so that total four ICs are received in the four grooves. The length of each groove for receiving an IC is the same as that of an IC package accommodating that IC. One IC is received in one of the grooves on the escape rail 54 by running the IC into the escape rail 54 from the buffer rail 53. In this state, since the IC positioned at the lowermost of the buffer rail 53 is stopped and held in that position by the movable stopper 53A provided on the buffer rail 53, the escape rail 54 can be moved in the lateral direction. By the movement of the escape rail 54 in the lateral direction, the IC received in the escape rail 54 and the IC on the buffer rail can surely be separated even if those packages are connected with each other by flashes or fins formed on both the packages. When all of the grooves of the escape rail 54 have received ICs therein, respectively, the escape rail 54 further moves laterally and transfers the ICs to a posture altering apparatus 60.

The posture altering apparatus 60 can be constituted by an arm 61 whose upper end is pivotally supported such that the arm 61 can rotate in a vertical plane as a rotating plane, drive means 63 supported at the lower end of the arm 61, a vacuum suction head 62 supported at the bottom surface of the drive means 63 such that the vacuum suction head 62 is movable linearly and reciprocatingly, and means such as a rotary air cylinder for rotating the arm 61 reciprocatingly over the range of an rotating angle of θ. The drive means 63 may be, for example, an air cylinder and linearly drives the vacuum suction head 62 so that it moves reciprocatingly along the axis of the arm 61.

The rotating angle θ is selected to be equal to an angle ranging from an angular position where the distal end surface of the vacuum suction head 62 comes to be parallel with the upper surface of the IC package supported on the escape rail 54 to an angular position where the distal end surface of the vacuum suction head 62 comes to be parallel with the upper surface of the carrying platform 65 which is on standby in a horizontal plane. The vacuum suction head 62 attracts an IC at the angular position where the vacuum suction head 62 faces with the IC supported on the escape rail 54 and then the arm 61 is revolved together with the IC attracted by the suction head 62 by the angle θ by the rotary air cylinder 64. By this rotating movement the posture or position of the IC is altered to horizontal posture or position. In the state of the horizontal posture, the vacuum suction head 62 is moved downwardly by the driving operation of the drive means 63 to transfer the IC to the carrying platform 65.

In the upper surface of the carrying platform 65 is formed a positioning recessed portion which is surrounded on four sides by upwardly and outwardly inclined walls. By dropping an IC down into the positioning recessed portion, the position of IC for a horizontal transporting means 70 located at next position in the course of movement of IC is defined. That is, upon receiving an IC from the posture altering apparatus 60, the carrying platform 65 moves in the direction of an arrow X and stops at the position A that is the starting point of transportation in the horizontal transporting means 70. A vacuum suction head 71 is on standby above the starting point A of transportation. This vacuum suction head 71 attracts the IC and transports the IC to the tray changing section 30 where the IC is dropped down into a test tray 31. Therefore, it is very useful for improvement of the operation efficiency or workability to define the IC position by the positioning recessed portion of the carrying platform 65.

Further, the escape rail 54 located at the downstream side of the buffer rail 53 has, for example, four to eight IC receiving grooves formed therein in the lateral direction of the escape rail (moving direction of the escape rail) in juxtaposition with one another. ICs are dropped one by one to each of these 4 to 8 grooves from the buffer rail 53. That is, each time an IC is dropped down into one groove, the escape rail 54 is moved laterally by one groove like pitch by pitch feeding manner. When all of the IC receiving grooves are filled with ICs, the escape rail 54 is further moved laterally and the posture altering apparatus 60 is activated. Therefore, 4 to 8 vacuum suction heads are also mounted to the posture altering apparatus 60 and hence the postures of 4 to 8 ICs are altered at a time. In addition, the horizontal transporting means 70 also has 4 to 8 vacuum suction heads 71 and is arranged to be able to transfer 4 to 8 ICs at a time to the test tray 31. The number of ICs is, however, not limited to 4 to 8.

As described above, in the previously proposed IC handler of tray/magazine combination type, the carrying platform 65 and the horizontal transporting means 70 are provided as means for transporting ICs to be tested supplied from the magazine 51 through the buffer rail 53 and the escape rail 54 to the test tray 31, and hence there is a shortcoming that the components of the apparatus are increased, and the cost thereof is high. In addition, since the carrying path of the ICs supplied from the magazine 51 is long, the time required for transporting the ICs is long. As a result, there is a disadvantage that the time duration of testing the ICs received in the magazine is long.

SUMMARY OF THE INVENTION

It is an object of the present invention to provide a semiconductor device transporting apparatus which can reduce the time period required for testing semiconductor devices to be tested supplied from a rod-like magazine accommodating the semiconductor devices therein and to provide a semiconductor device posture altering apparatus which can cooperate with this semiconductor device transporting apparatus.

Another object of the present invention is to provide a semiconductor device posture altering apparatus which can alter the posture of a semiconductor device from an inclined posture to horizontal posture at a relatively high speed.

It is still another object of the present invention to provide a semiconductor device take-out apparatus which can efficiently take out semiconductor devices from a rod-like magazine accommodating semiconductor devices therein in the state that the magazine is maintained in the horizontal posture.

In accordance with a first aspect of the present invention, there is provided a semiconductor device transporting apparatus which comprises: movable supporting means for supporting thereon a rod-like magazine for accommodating semiconductor devices therein and capable of holding the rod-like magazine in an inclined posture by which the semiconductor devices can slide down by their own weights by the movement of said supporting means; means for discharging the semiconductor devices accommodated in said magazine therefrom by a natural sliding force of the semiconductor devices by their own weights; posture altering apparatus for altering the posture of each of the discharged semiconductor devices in the inclined state to horizontal posture; device suction means for attracting a semiconductor device in the horizontal posture; and horizontal transporting means for transporting the semiconductor device attracted by said device suction means with the horizontal posture held onto a test tray and for dropping the attracted semiconductor device down into an recess for receiving a semiconductor device provided on said test tray.

In the semiconductor device transporting apparatus according to the present invention, the semiconductor device posture altering means is provided at the lower end portion of the rod-like semiconductor device receiving magazine supported in an inclined posture so that a semiconductor device to be tested can be directly transferred from the semiconductor device posture altering apparatus to the test tray. According to this construction, the length of the semiconductor device transporting path can be reduced. As a result, the time period required for testing ICs received in the magazine can be reduced. In addition, since the configuration or construction of the apparatus is made simple, the cost thereof can be reduced.

In accordance with a first preferred embodiment of the present invention, there is provided a semiconductor device posture altering apparatus which comprises: movable supporting means for supporting thereon a rod-like magazine for accommodating semiconductor devices therein and capable of holding the rod-like magazine in an inclined posture by which the semiconductor devices can slide down by their own weights by the movement of said supporting means; means for discharging the semiconductor devices accommodated in said magazine therefrom by a natural sliding force of the semiconductor devices by their own weights; and posture altering apparatus for altering the posture of each of the discharged semiconductor devices in the inclined state to horizontal posture, and said posture altering apparatus comprises: an escape rail located at the downstream side of said magazine for separating one by one a series of semiconductor devices discharged from said magazine; a posture altering rail to which at least one semiconductor device separated one by one by said escape rail is fed from said escape rail and having at least one groove whose slope gradually changes to horizontal thereby altering the posture of the semiconductor device in the inclined state fed from said escape rail to horizontal posture; device suction means for attracting a semiconductor device in the horizontal posture; and means for transporting the semiconductor device attracted by said device suction means with the horizontal posture held onto a test tray.

In accordance with a second preferred embodiment of the present invention, there is provided a semiconductor device posture altering apparatus which comprises: movable supporting means for supporting thereon a rod-like magazine for accommodating semiconductor devices therein and capable of holding the rod-like magazine in an inclined posture by which the semiconductor devices can slide down by their own weights by the movement of said supporting means; means for discharging the semiconductor devices accommodated in said magazine therefrom by a natural sliding force of the semiconductor devices by their own weights; and posture altering apparatus for altering the posture of each of the discharged semiconductor devices in the inclined state to horizontal posture, and said posture altering apparatus comprises: an escape rail located at the downstream side of said magazine for separating one by one a series of semiconductor devices discharged from said magazine; a movable posture altering rail having its lower end portion pivotally mounted and normally being in an inclined state, at least one semiconductor device separated one by one by said escape rail being fed to said movable posture altering rail from said escape rail; means for rotating said movable posture altering rail in the inclined state to horizontal posture thereby altering the posture of the semiconductor devices in the inclined state to horizontal posture each time a predetermined number of semiconductor devices are fed to said movable posture altering rail from said escape rail; device suction means for attracting a semiconductor device in the horizontal posture on said movable posture altering rail; and means for transporting the semiconductor device attracted by said device suction means with the horizontal posture held onto a test tray.

In accordance with a third preferred embodiment of the present invention, there is provided a semiconductor device posture altering apparatus which comprises: movable supporting means for supporting thereon a rod-like magazine for accommodating semiconductor devices therein and capable of holding the rod-like magazine in an inclined posture by which the semiconductor devices can slide down by their own weights by the movement of said supporting means; means for discharging the semiconductor devices accommodated in said magazine therefrom by a natural sliding force of the semiconductor devices by their own weights; and posture altering apparatus for altering the posture of each of the discharged semiconductor devices in the inclined state to horizontal posture, and said posture altering apparatus comprises: an escape rail located at the downstream side of said magazine for separating one by one a series of semiconductor devices discharged from said magazine; a movable posture altering rail having its lower end portion pivotally mounted and normally being in an inclined state, at least one semiconductor device separated one by one by said escape rail being fed to said movable posture altering rail from said escape rail; means for rotating said movable posture altering rail in the inclined state to horizontal posture thereby altering the posture of the semiconductor devices in the inclined state to horizontal posture each time a predetermined number of semiconductor devices are fed to said movable posture altering rail from said escape rail; means for moving said movable posture altering rail in the horizontal direction away from said escape rail; device suction means for attracting a semiconductor device in the horizontal posture on said movable posture altering rail; and means for transporting the semiconductor device attracted by said device suction means with the horizontal posture held onto a test tray.

In accordance with a fourth preferred embodiment of the present invention, there is provided a semiconductor device posture altering apparatus which comprises: movable supporting means for supporting thereon a rod-like magazine for accommodating semiconductor devices therein and capable of holding the rod-like magazine in an inclined posture by which the semiconductor devices can slide down by their own weights by the movement of said supporting means; means for discharging the semiconductor devices accommodated in said magazine therefrom by a natural sliding force of the semiconductor devices by their own weights; and posture altering apparatus for altering the posture of each of the discharged semiconductor devices in the inclined state to horizontal posture, and said posture altering apparatus comprises: an escape rail located at the downstream side of said magazine for separating one by one a series of semiconductor devices discharged from said magazine; a movable posture altering rail having its upper end portion pivotally mounted and normally being in an inclined state, at least one semiconductor device separated one by one by said escape rail being fed to said movable posture altering rail from said escape rail; means for rotating said movable posture altering rail in the inclined state to horizontal posture thereby altering the posture of the semiconductor devices in the inclined state to horizontal posture each time a predetermined number of semiconductor devices are fed to said movable posture altering rail from said escape rail; device suction means for attracting a semiconductor device in the horizontal posture on said movable posture altering rail; and means for transporting the semiconductor device attracted by said device suction means with the horizontal posture held onto a test tray.

In accordance with a fifth preferred embodiment of the present invention, there is provided a semiconductor device posture altering apparatus which comprises: movable supporting means for supporting thereon a rod-like magazine for accommodating semiconductor devices therein and capable of holding the rod-like magazine in an inclined posture by which the semiconductor devices can slide down by their own weights by the movement of said supporting means; means for discharging the semiconductor devices accommodated in said magazine therefrom by a natural sliding force of the semiconductor devices by their own weights; and posture altering apparatus for altering the posture of each of the discharged semiconductor devices in the inclined state to horizontal posture, and said posture altering apparatus comprises: an escape rail located at the downstream side of said magazine for separating one by one a series of semiconductor devices discharged from said magazine; positioning means in an inclined posture for receiving one by one the semiconductor devices separated by said escape rail and accurately positioning the position of receiving the semiconductor device; device suction means rotatably supported in a vertical plane for attracting the semiconductor device in the inclined posture supported on said positioning means; means for rotating said device suction means so as to alter the posture thereof to a posture perpendicular to horizontal plane thereby altering the posture of the semiconductor device attracted by said device suction means to horizontal posture; and means for transporting the semiconductor device attracted by said device suction means with the horizontal posture held onto a test tray.

In accordance with a sixth preferred embodiment of the present invention, there is provided a semiconductor device posture altering apparatus which comprises: movable supporting means for supporting thereon a rod-like magazine for accommodating semiconductor devices therein and capable of holding the rod-like magazine in an inclined posture by which the semiconductor devices can slide down by their own weights by the movement of said supporting means; means for discharging the semiconductor devices accommodated in said magazine therefrom by a natural sliding force of the semiconductor devices by their own weights; and posture altering apparatus for altering the posture of each of the discharged semiconductor devices in the inclined state to horizontal posture, and said posture altering apparatus comprises: a buffer rail in an inclined posture located at the downstream side of said magazine; a movable stopper provided at the lower end portion of said buffer rail for functioning to keep the semiconductor device positioned at said lower end portion to be discharged from said buffer rail as well as to enable the semiconductor device to be discharged from said buffer rail if necessary; a posture altering rotator located at the downstream side of said buffer rail and rotatable about its axis of rotation, said posture altering rotator having at least one pair of rotary arms diametrically opposed to each other, said pair of rotary arms having the same angle of inclination given so that when one of said rotary arms is aligned with said buffer rail in the inclined state, the other rotary arm is in the horizontal plane, a semiconductor device in the inclined posture discharged from said buffer rail being received in the one rotary arm coupled to the downstream side of said buffer rail in alignment therewith; means for rotating said posture altering rotator such that the posture of the semiconductor device in the inclined state supported on the one rotary arm is altered to horizontal posture by revolution of that rotary arm by 180°; device suction means for attracting a semiconductor device in the horizontal posture on one rotary arm; and means for transporting the semiconductor device attracted by said device suction means with the horizontal posture held onto a test tray.

In accordance with a seventh preferred embodiment of the present invention, there is provided a semiconductor device posture altering apparatus which comprises: movable supporting means for supporting thereon a rod-like magazine for accommodating semiconductor devices therein and capable of holding the rod-like magazine in an inclined posture by which the semiconductor devices can slide down by their own weights by the movement of said supporting means; means for discharging the semiconductor devices accommodated in said magazine therefrom by a natural sliding force of the semiconductor devices by their own weights; and posture altering apparatus for altering the posture of each of the discharged semiconductor devices in the inclined state to horizontal posture, and said posture altering apparatus comprises: a buffer rail in an inclined posture located at the downstream side of said magazine, and for holding a plurality of semiconductor devices discharged from said magazine; a movable stopper provided at the lower end portion of said buffer rail for functioning to keep the semiconductor device positioned at the lowest end of said buffer rail among the semiconductor devices held on said buffer rail to be discharged from said buffer rail as well as to enable the semiconductor devices to be discharged from said buffer rail if necessary; a posture altering rotator located at the downstream side of said buffer rail and rotatable about its axis of rotation positioned on a bisector dividing into two equal parts an angle that the axis of said magazine and said buffer rail makes with the horizontal plane, said posture altering rotator having a pair of rotary arms diametrically opposed to each other, said pair of rotary arms having the same angle of inclination given so that when one of said rotary arms is aligned with said buffer rail in the inclined state, the other rotary arm is placed in a posture parallel to the horizontal plane; device suction means provided on each of said rotary arms for attracting, when a semiconductor device in the inclined posture discharged from said buffer rail is received in one rotary arm coupled to the lower end portion of said buffer rail in alignment therewith, the inner side of this semiconductor device; means for rotating said posture altering rotator such that the posture of the semiconductor device in the inclined state attracted by the device suction means is altered to horizontal posture by revolution of that rotary arm by 180°; and positioning means provided underneath the semiconductor device in the horizontal posture for receiving the semiconductor device released from said device suction means with the horizontal posture held and defining the position of receiving the semiconductor device.

In accordance with a eighth preferred embodiment of the present invention, there is provided a semiconductor device posture altering apparatus which comprises: movable supporting means for supporting thereon a rod-like magazine for accommodating semiconductor devices therein and capable of holding the rod-like magazine in an inclined posture by which the semiconductor devices can slide down by their own weights by the movement of said supporting means; means for discharging the semiconductor devices accommodated in said magazine therefrom by a natural sliding force of the semiconductor devices by their own weights; and posture altering apparatus for altering the posture of each of the discharged semiconductor devices in the inclined state to horizontal posture, and said posture altering apparatus comprising: an escape rail in an inclined posture located at the downstream side of said magazine for separating one by one a series of semiconductor devices discharged from said magazine; a movable stopper provided at said escape rail for functioning to keep a semiconductor device separated by said escape rail to be discharged from said escape rail; positioning means provided at a position in the downstream of said escape rail and disposed in the horizontal posture, said escape rail and said positioning means being arranged to have such relation of position that the forward end of the semiconductor device discharged from said escape rail by releasing said movable stopper abuts against the end wall of a positioning recess formed in said positioning means whereby the semiconductor device remains in an inclined posture; drive means for moving said escape rail and said positioning means in the direction away from each other; and means for operating said drive means to drop the semiconductor device in the inclined posture down into said positioning recess thereby altering the posture of the semiconductor device in the inclined state to horizontal posture.

In accordance with a second aspect of the present invention, there is provided a semiconductor device take-out apparatus which comprises: drive means for feeding semiconductor devices from a rod-like magazine for accommodating semiconductor devices supported in the horizontal posture; a buffer rail for receiving a plurality of semiconductor devices pushed out by said drive means; a movable stopper provided at the vicinity of the exit port of said buffer rail; and positioning means for receiving one by one the semiconductor devices pushed out from said buffer rail and holding the semiconductor devices in horizontal posture with the semiconductor devices positioned.

DESCRIPTION OF THE PREFERRED EMBODIMENTS

Now the embodiments of the present invention will be described in detail with reference to the accompanying drawings.

Figure 1:
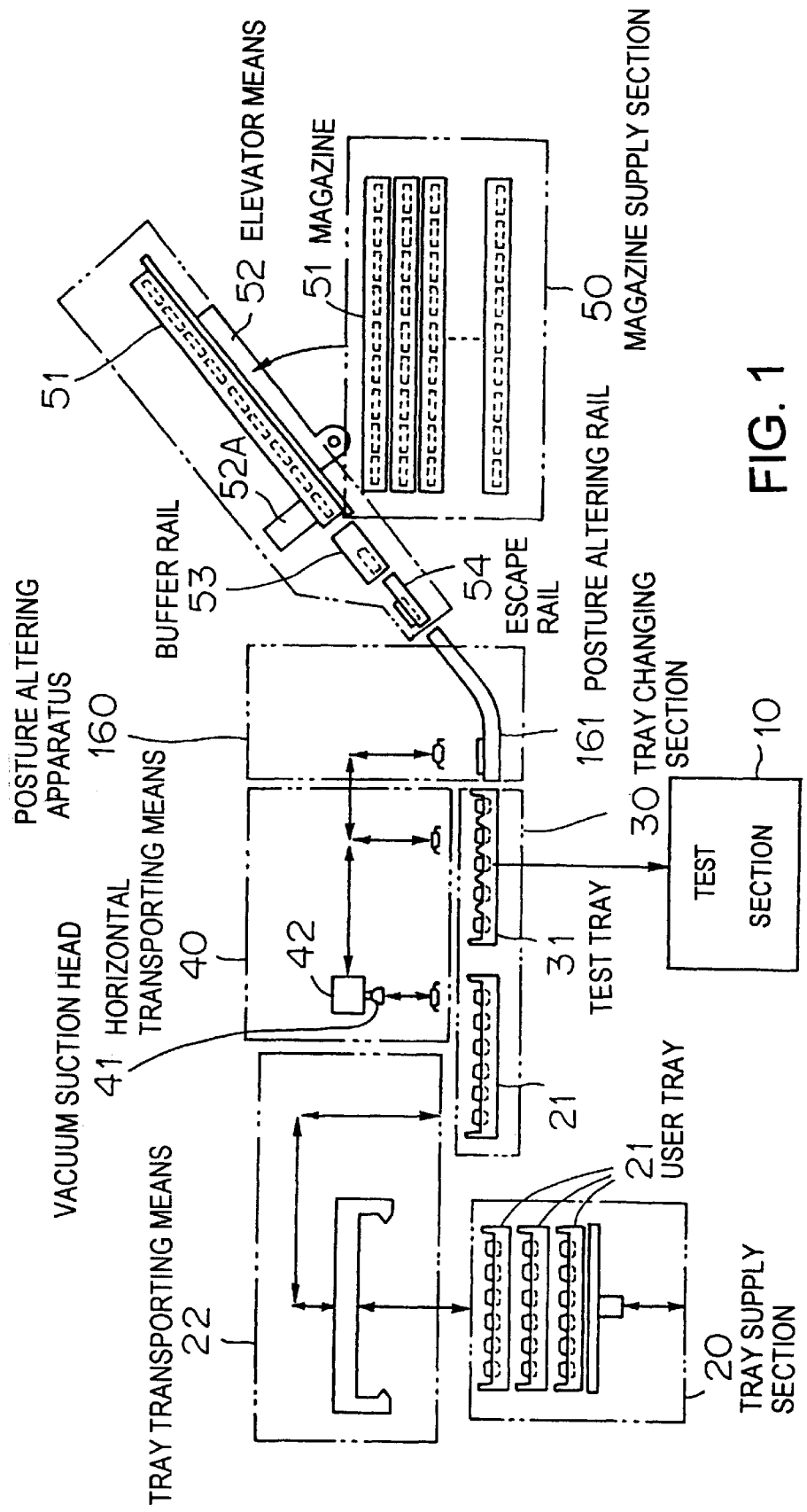
FIG. 1 is a side view showing in outline the construction of a first embodiment of the posture altering section according to the present invention applied to a magazine/tray combination type IC handler.
Figure 15:
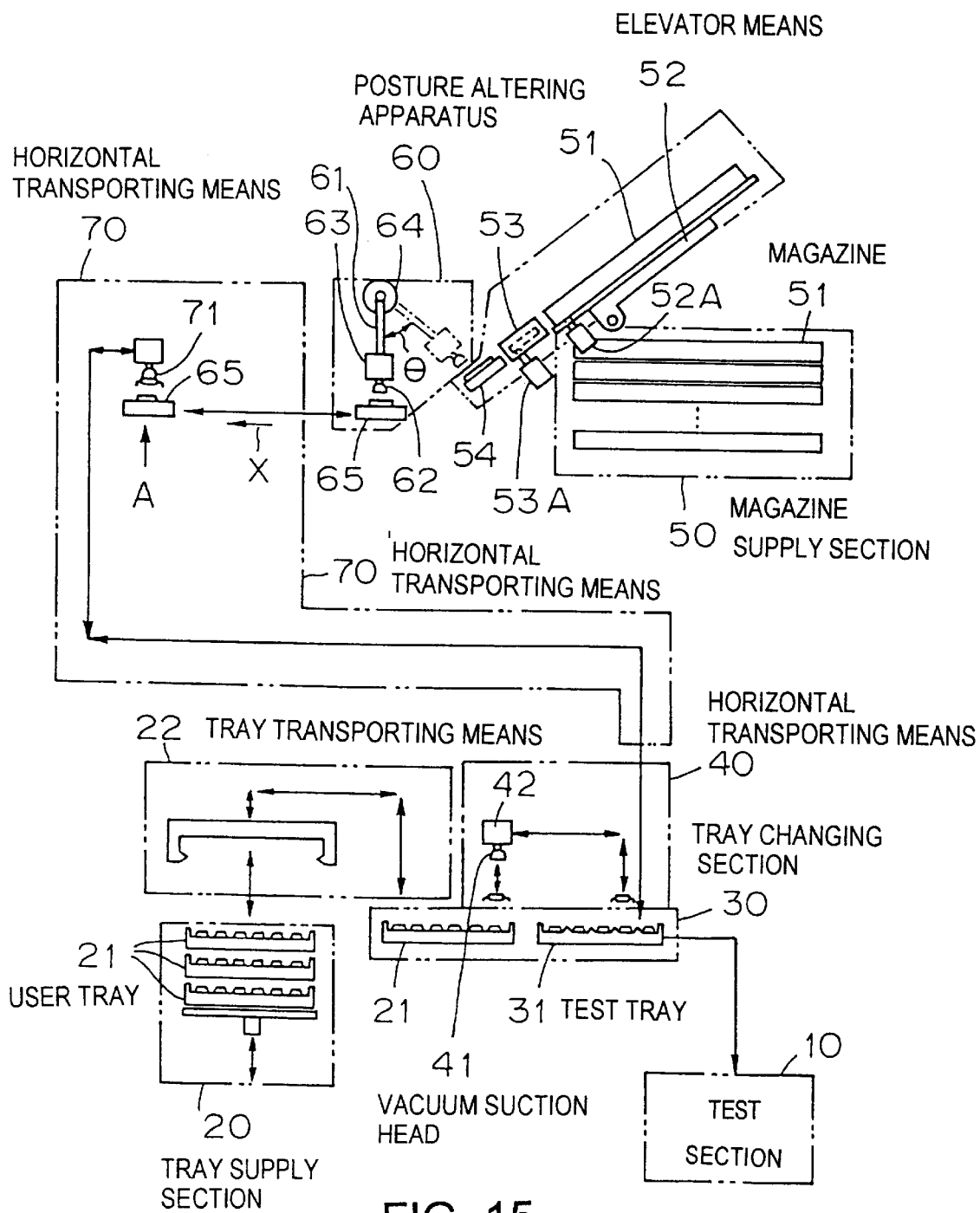
FIG. 15 is a side view showing in outline the construction of a prior magazine/tray combination type IC handler.

FIG. 1 shows the construction of a first embodiment of the posture altering section according to the present invention applied to a magazine/tray combination type IC handler of horizontal transporting system. In FIG. 1, the construction that a user tray 21 is conveyed from a tray supply section 20 to a tray changing section 30 by tray transporting means 22 and ICs to be tested received in the user tray 21 are transferred or transshipped from the user tray 21 to a test tray 31 is the same as that of the prior art apparatus previously described referring to FIG. 15, and hence the explanation thereof will be omitted.

In the present invention, a posture altering apparatus 160 is provided in the vicinity of the tray changing section 30. The posture of an IC to be tested in an inclined state is directly altered to horizontal posture by the posture altering apparatus 160, and then the IC is transshipped to the test tray 31 by horizontal transporting means. The present invention is particularly characterized by the above point and the construction of the posture altering apparatus 160.

The embodiment shown in FIG. 1 is the case where the posture altering apparatus 160 is constituted by a posture altering rail 161. This posture altering rail 161 is of a configuration which is gradually reduced in the angle of inclination in the middle portion thereof such that the posture altering rail 161 has the same slope as that of the magazine 51 and hence that of an escape rail 54 constituting an escape mechanism at the side (upstream side) of the posture altering rail abutting on the escape rail 54 and assumes the horizontal posture at the opposite side (downstream side) thereof abutting on the test tray 31.

Figure 2:
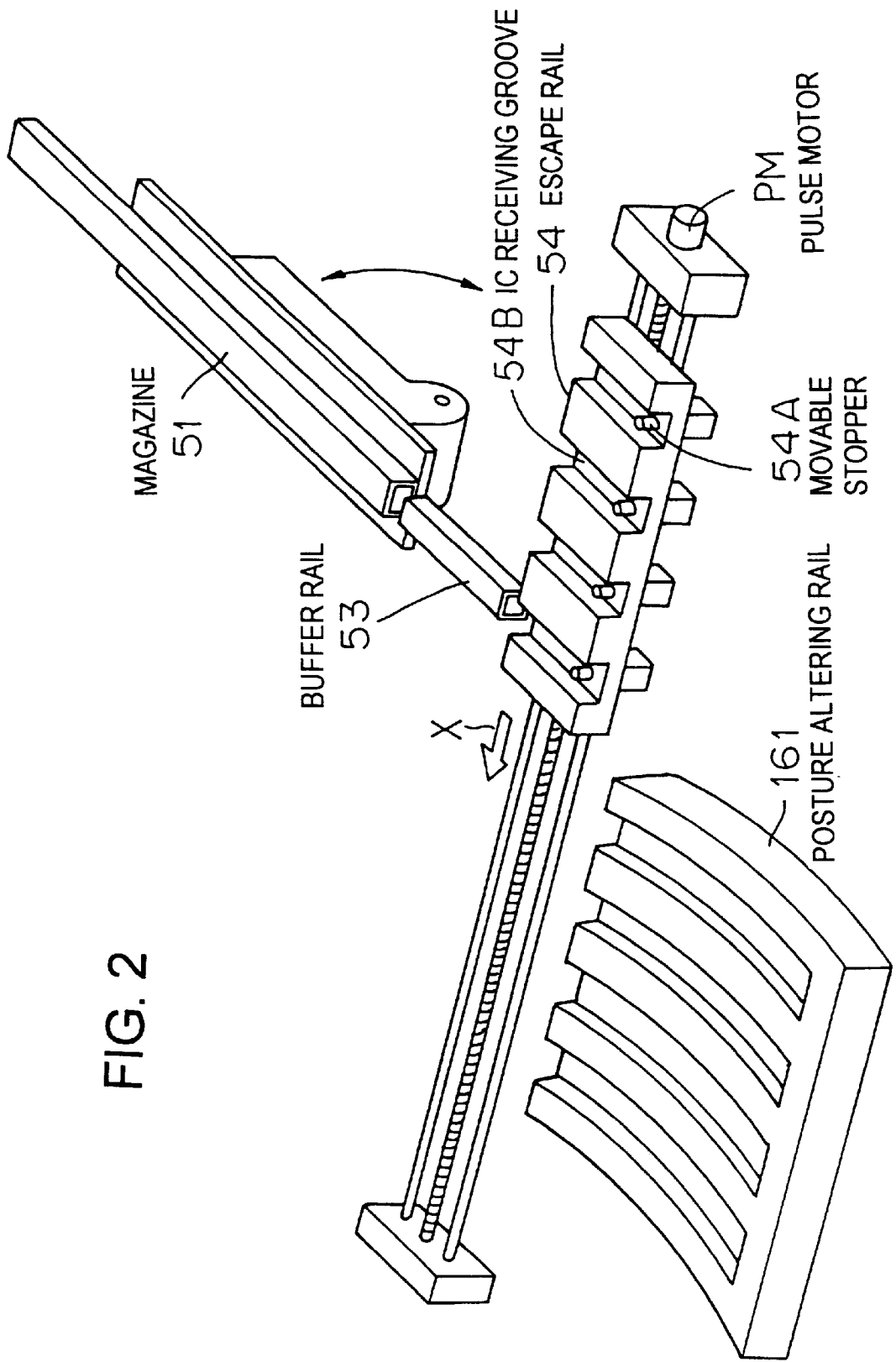
FIG. 2 is a perspective view showing in detail the relationship of disposition of the magazine, the buffer rail, the escape rail and the posture altering rail illustrated in FIG. 1.

FIG. 2 shows in detail the relationship between the escape rail 54, the magazine 51, a buffer rail 53 and the posture altering rail 161. FIG. 2 shows an example where four IC receiving grooves 54B are provided in the escape rail 54 in juxtaposition with one another. A movable stopper 54A is provided at the lower end portion of each of the IC receiving grooves. An IC to be tested transferred from the buffer rail 53 is held in each groove 54B of the escape rail 54 by the movable stopper 54A. In synchronism with that an IC is fed into one of the IC receiving grooves, the escape rail 54 is moved toward the direction of arrow X by, for example, a pulse motor PM by one pitch of the IC receiving groove 54B whereby ICs are received one by one in each of the IC receiving grooves 54B. When ICs are received in all of the IC receiving grooves 54B, the escape rail 54 is further moved toward the direction of arrow X and abuts on the upper end of the posture altering rail 161 which constitutes the posture altering apparatus 160. In the state that the escape rail 54 abuts on the upper end of the posture altering rail 161, the movable stoppers 54A are pulled down so as to be withdrawn from the IC receiving grooves so that the ICs to be tested held on the escape rail 54 run out into the upper end of the posture altering rail 161 by their own weights. The ICs run into the posture altering rail are changed in their postures gradually from the inclined postures to the horizontal postures following the slope of the posture altering rail 161 during the ICs are sliding on the posture altering rail 161 by their own weights.

The lower end of the posture altering rail 161 is closed, and thus the forward ends of the packages of the ICs sliding by their own weights abut against this closed end. Therefore, the position of each IC the posture of which has been altered can accurately be defined by this closed end.

As mentioned above, since the position of the IC is defined and registered at the lower end of the posture altering rail 161, it is possible to use, as the horizontal transporting means for transporting ICs from the lower end of the posture altering rail 161 onto the test tray 31 (see FIG. 1), the horizontal transporting means 40 for transporting ICs from the user tray 21 onto the test tray 31 at the tray changing section 30 as shown in FIG. 1. That is, since the posture altering apparatus 160 is positioned in the vicinity of the test tray 31 having stopped at the tray changing section 30, the horizontal transporting means 40 can be used in common as the transporting means for transporting ICs supplied from the user tray 21 as well as ICs supplied from the magazine 51. Moreover, since the vacuum suction head 41 of the horizontal transporting means 40 can attract an IC having stopped at the lower end portion of the posture altering rail 161 in the state that the position of centroid or center of gravity of an IC is aligned with the axis of the vacuum suction head 41, the IC can surely be loaded onto the test tray 31 by the definition or registration of position at the lower end of the posture altering rail 161.

Figure 3:
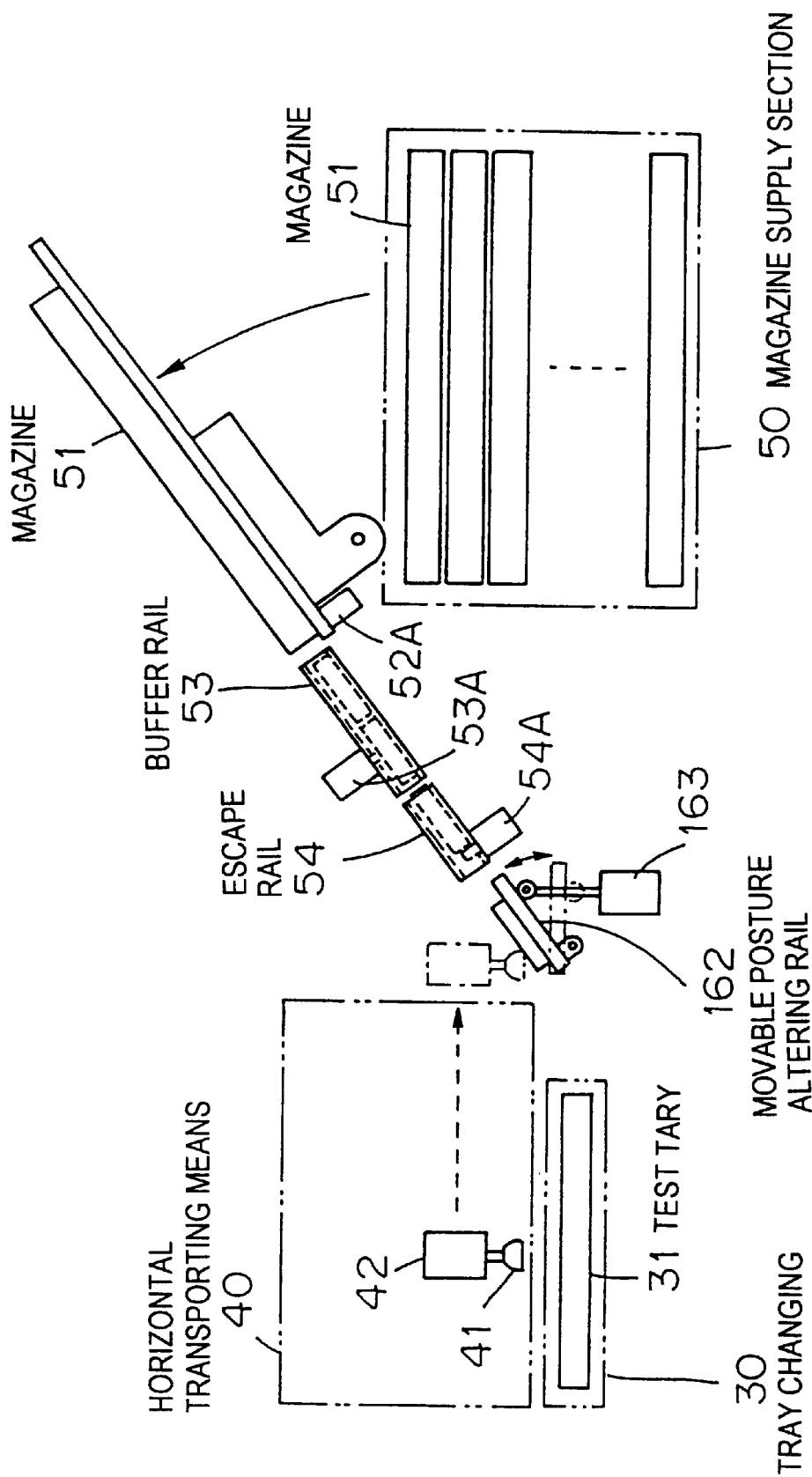
FIG. 3 is a side view showing in outline the construction of a second embodiment of the posture altering section according to the present invention.

FIG. 3 shows the construction of a second embodiment of the posture altering section according to the present invention. Further, since the construction of the tray transportation side is not related to the subject matter of the present invention, the construction of thereof is omitted from the drawings on and after FIG. 3. In the second embodiment shown in FIG. 3, the posture altering apparatus 160 comprises a movable posture altering rail 162 and an air cylinder 163 for rotating the movable posture altering rail 162. The movable posture altering rail 162 is provided at the downstream side of the escape rail 54. In this embodiment, the downstream side of the movable posture altering rail 162 is pivotally supported by an axis such that the upstream side thereof can rotate in the up-and-down direction. The rotation of the upstream side of the movable posture altering rail 162 in the up-and-down direction is driven by the air cylinder 163 such that the upstream side of the movable posture altering rail 162 moves between the inclined position shown in the drawing abutting on the lower end portion of the escape rail 54 and the horizontal position shown by phantom (chain line). That is, an IC is received onto the movable posture altering rail 162 from the escape rail 54 at the inclined position abutting on the lower end portion of the escape rail 54, and then the movable posture altering rail 162 is rotated to the horizontal position by the driving force of the air cylinder 163 to give horizontal posture to the received IC on the rail 162. Thus, the posture of the IC is altered or changed to the horizontal posture from the inclined posture.

Figure 4:
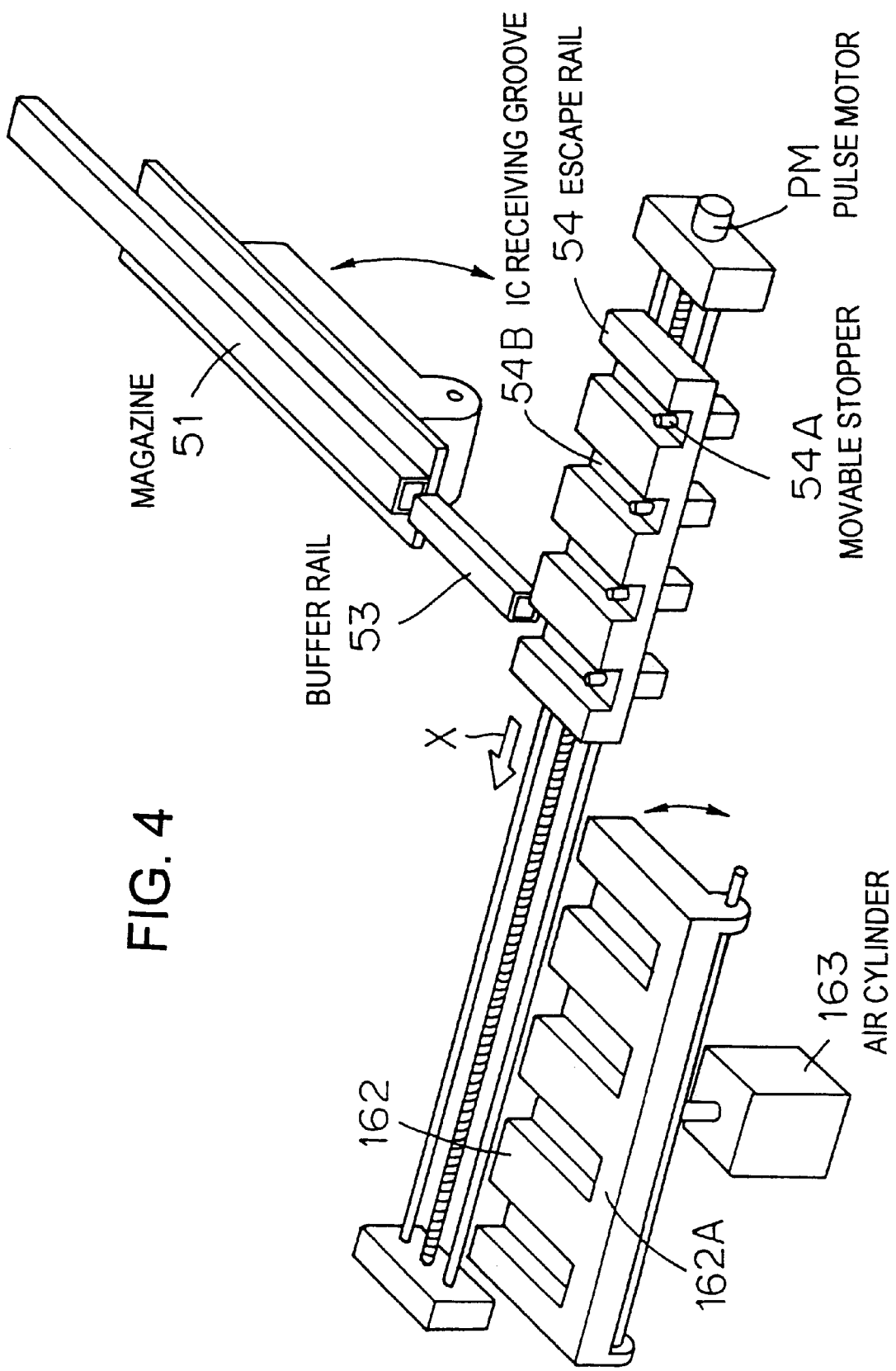
FIG. 4 is a perspective view showing in detail the relationship of disposition of the magazine, the buffer rail, the escape rail and the movable rail for posture alteration illustrated in FIG. 3.

FIG. 4 shows in detail the relationship between the escape rail 54, the magazine 51, the buffer rail 53 and the movable posture altering rail 162. Like the first embodiment mentioned above, in this embodiment the escape rail 54 and the movable posture altering rail 162 have also four IC receiving grooves 54B and four IC receiving rails, respectively. When an IC is received by each of the IC receiving grooves 54B of the escape rail 54, the escape rail 54 is moved to the upstream position of the movable posture altering rail 162 and then the ICs on the escape rail are slid down and run into the movable posture altering rail 162 from the escape rail 54 by removing the movable stoppers 54A. The lower end of the movable posture altering rail 162 is closed by a closing plate 162A against which the front end of the package of each IC abuts. As a result, the positions of all ICs come to be uniform (the edges of all ICs are trued up). In the state that the IC positions are uniformly defined, the air cylinder 163 is driven to move down the upstream side of the movable posture altering rail 162. When the upstream side of the movable posture altering rail 162 is moved down to the horizontal position, the air cylinder 163 is stopped to drive. In such a way, the movable posture altering rail 162 is held in the horizontal posture. At this horizontal position, the vacuum suction head 41 of the horizontal transporting means 40 is moved to the upper portion of the movable posture altering rail 162 to attract the IC and then the IC attracted against the suction head 41 is transported to the test tray 31.

In this second embodiment, the position of the IC to be tested is also defined and registered at the lower end portion of the movable posture altering rail 162, and hence the horizontal transporting means 40 for transferring ICs from the user tray 21 to the test tray 31 at the tray changing section 30 can be used, too, as the horizontal transporting means for transporting the ICs from the lower end portion of the movable posture altering rail 162 to the test tray 31 (see FIG. 1). In addition, since the vacuum suction head 41 of the horizontal transporting means 40 can attract an IC having stopped at the lower end portion of the movable posture altering rail 162 in the state that the position of the center of gravity of the IC is aligned with the axis center of the suction head 41, the IC can surely be loaded to the test tray 31 due to the uniform definition of the IC positions at the lower end portion of the movable posture altering rail 162.

Figure 5:
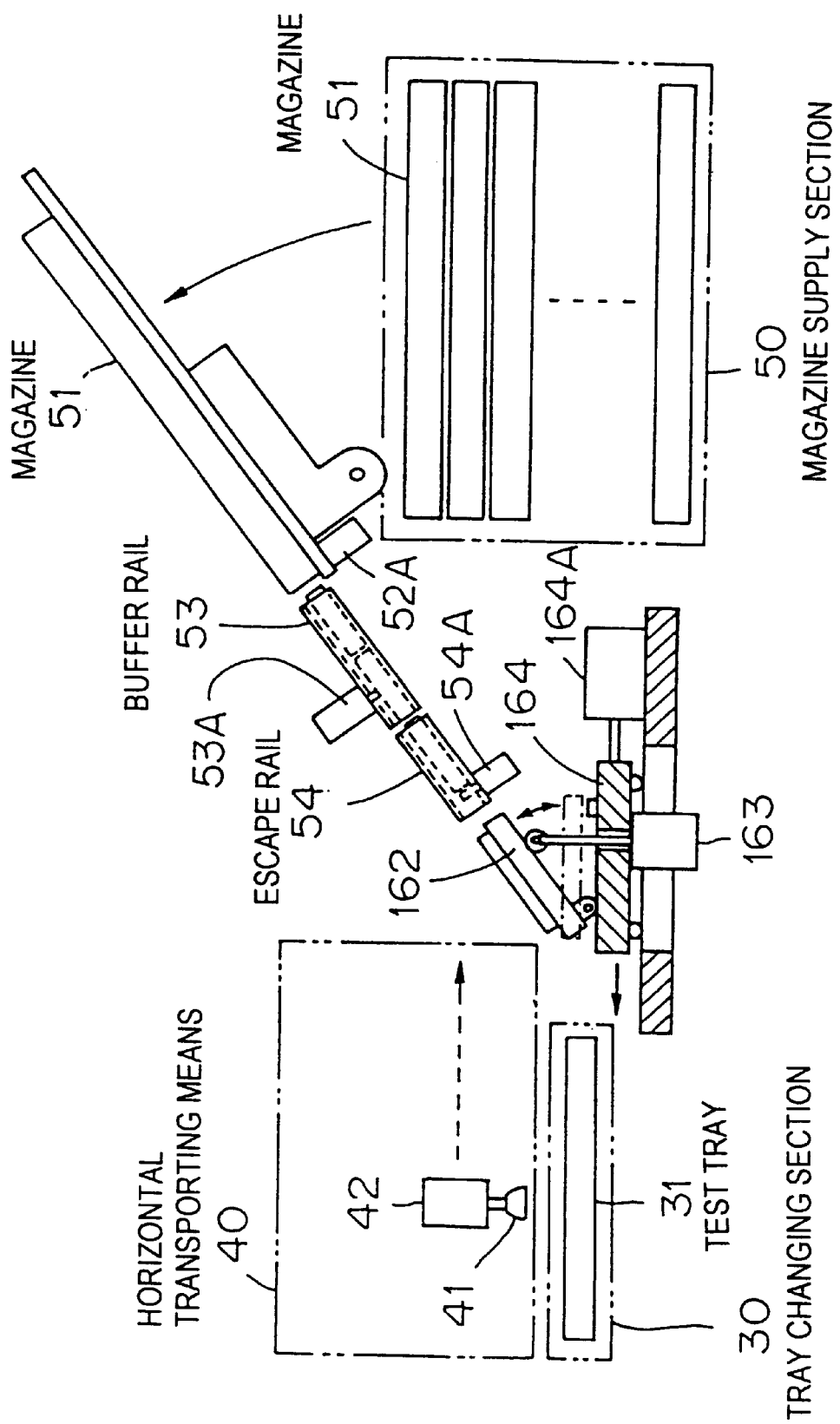
FIG. 5 is a side view showing in outline the construction of a third embodiment of the posture altering section according to the present invention.

FIG. 5 shows the construction of a third embodiment of the posture altering section according to the present invention. In this embodiment, the posture altering apparatus 160 comprises the movable posture altering rail 162 and the air cylinder 163 for rotating the movable posture altering rail 162 both of which are the same constructions as those in the second embodiment, a carrying platform 164 on which the movable posture altering rail 162 is placed, and an air cylinder 164A for driving the carrying platform 164 toward the tray changing section 30. The movable posture altering rail 162 mounted on the carrying platform 164 receives an IC to be tested from the escape rail 54 when the posture altering rail 162 is in the inclined position. After the movable posture altering rail 162 is rotated down to the horizontal posture position, the carrying platform 164 is slightly moved toward the tray changing section 30. After that, the vacuum suction head 41 of the horizontal transporting means 40 is moved to the upper portion of the movable posture altering rail 162 to attract the IC thereagainst and the IC attracted against the suction head 41 is transported to the test tray 31.

As mentioned above, with the construction that the movable posture altering rail 162 is slightly moved toward the tray changing section 30 after the posture of the rail 162 is changed to horizontal, there is obtained an advantage that the vacuum suction head 41 of the horizontal transporting means 40 can be moved down nearly to the predetermined position of the IC to be tested on the movable posture altering rail 162. That is, in the second embodiment shown in FIGS. 3 and 4, the arrangement thereof is such that when the movable posture altering rail 162 is rotated down to the horizontal posture position, a portion of the upstream side of the movable posture altering rail 162 enters the underside of the escape rail 54. Therefore, in this case, there may be a possibility that the escape rail 54 becomes an obstacle to the horizontal transporting means 40 in approaching the upper surface of the movable posture altering rail 162. However, in the arrangement of the third embodiment, the escape rail 54 does not become an obstacle at all to the horizontal transporting means 40 in approaching the upper surface of the movable posture altering rail 162. Since other remaining construction and operation of the third embodiment are the same as those in the second embodiment, the explanations thereof are omitted.

Figure 6:
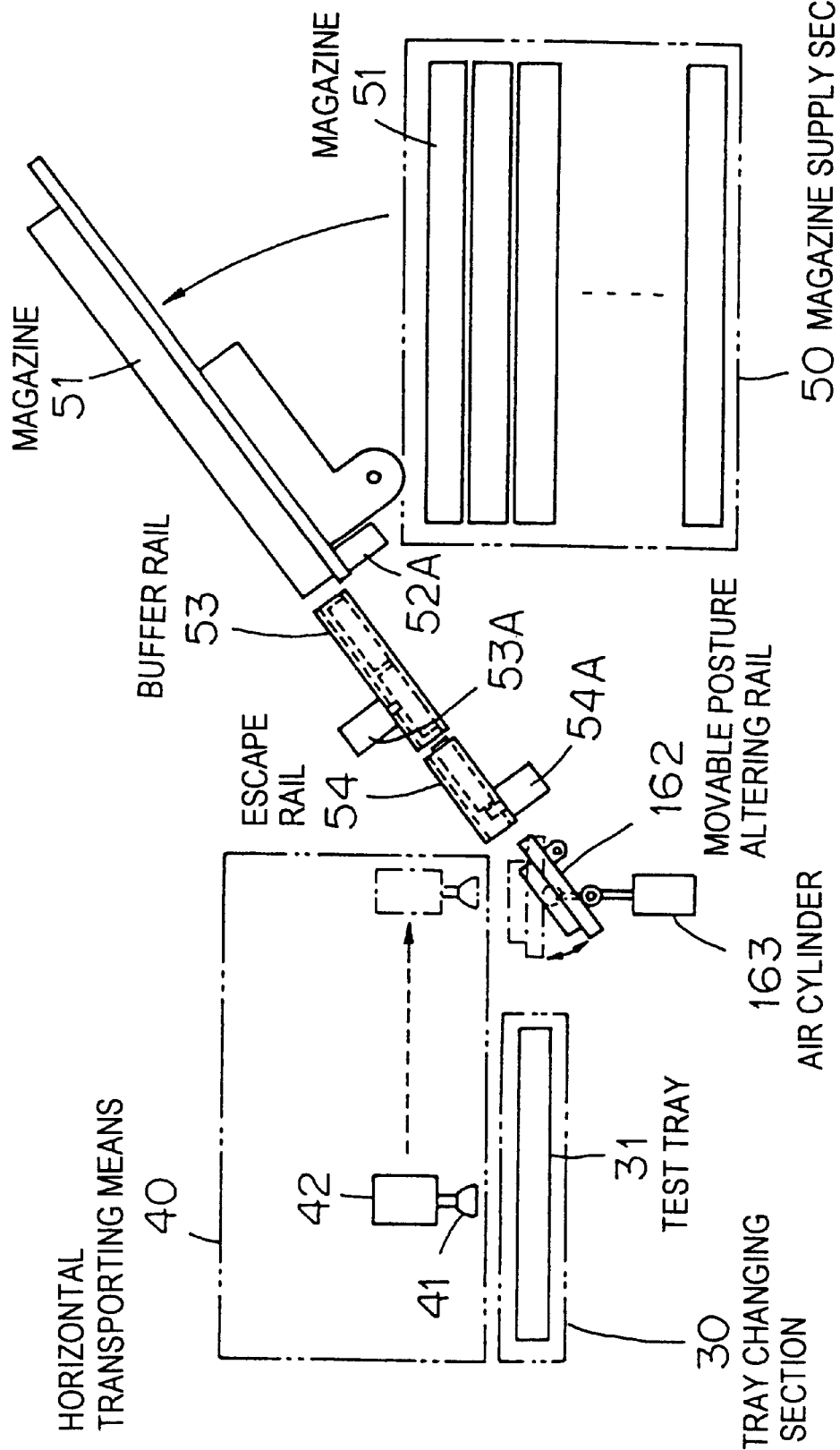
FIG. 6 is a side view showing in outline the construction of a fourth embodiment of the posture altering section according to the present invention.

FIG. 6 shows the construction of a fourth embodiment of the posture altering section according to the present invention. In this embodiment, similarly to the second embodiment, the posture altering apparatus 160 comprises the movable posture altering rail 162 and the air cylinder 163 for rotating the movable posture altering rail 162. However, on the contrary to the second embodiment, the posture altering apparatus 160 of the fourth embodiment is arranged such that the upstream side of the movable posture altering rail 162 is pivotally supported by an axis and the downstream side thereof is rotated to the up-and-down direction by means of the air cylinder 163. According to this construction, when the movable posture altering rail 162 is rotated down to the horizontal posture position, a portion of the upstream side of the movable posture altering rail 162 does not enter the underside of the escape rail 54. Therefore, even though there is not provided the carrying platform 164 as in the third embodiment shown in FIG. 5, the vacuum suction head 41 of the horizontal transporting means 40 can be moved down nearly to the predetermined position of the upper portion of the movable posture altering rail 162 without being obstructed by the escape rail 54. Since other remaining construction and operation of the fourth embodiment are the same as those in the second embodiment, the explanations thereof are omitted.

Figure 7:
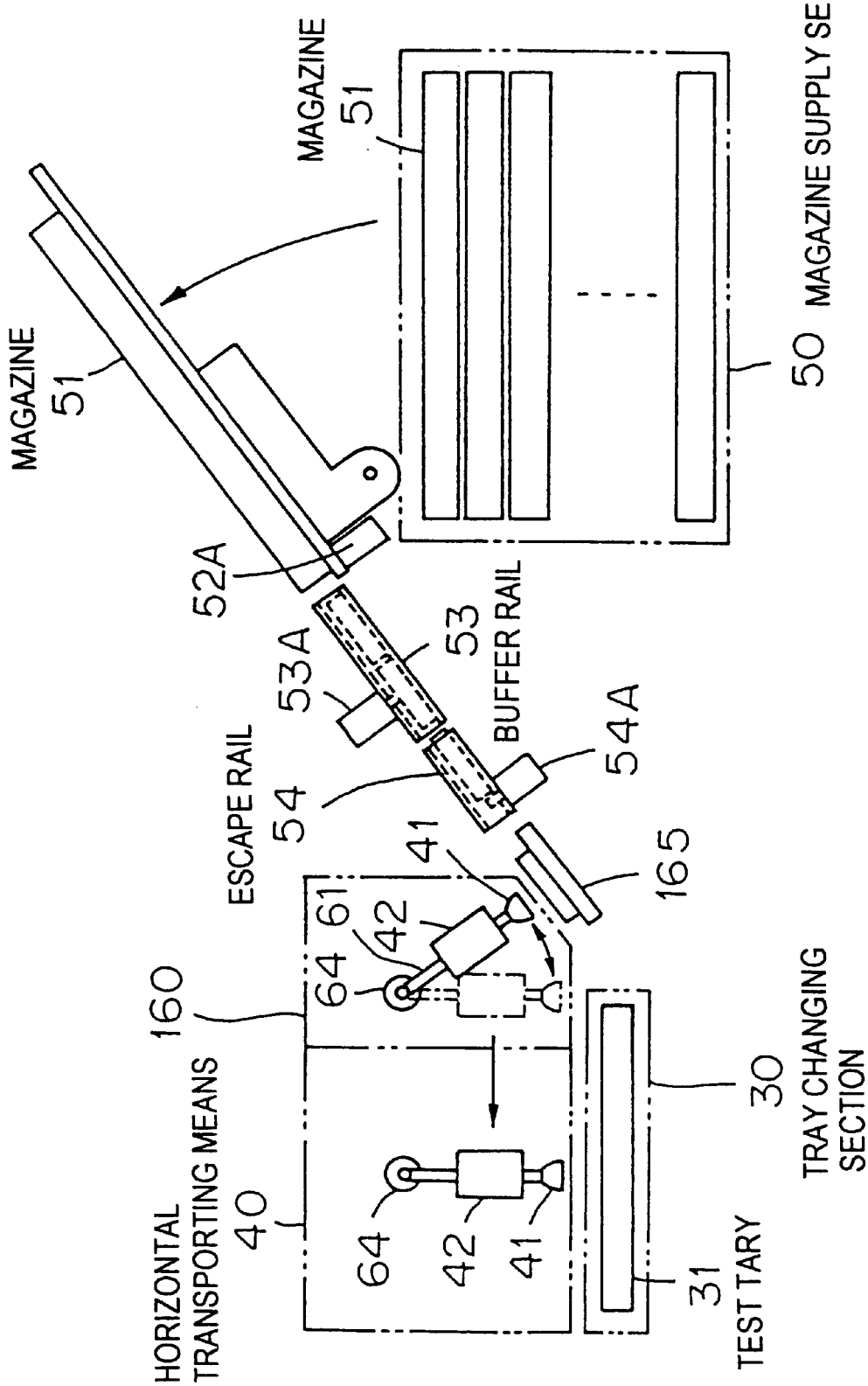
FIG. 7 is a side view showing in outline the construction of a fifth embodiment of the posture altering section according to the present invention.

FIG. 7 shows the construction of a fifth embodiment of the posture altering section according to the present invention. In this embodiment, the posture altering apparatus 160 comprises a fixed rail 165, an arm 61 having the upper end pivotally mounted such that the arm 61 can rotate in a vertical plane as a rotating plane, and a drive means, for example, a rotary type air cylinder 64 for driving the arm 61 to reciprocatingly rotate within a predetermined rotation angle. In addition, an air cylinder 42 for linearly reciprocating the vacuum suction head 41 of the horizontal transporting means 40 is supported on the lower end of the arm 61. In other word, the posture altering apparatus 160 is arranged such that the air cylinder 42 and the vacuum suction head 41 of the horizontal transporting means 40 can be rotationally reciprocated within the predetermined rotation angle.

The fixed rail 165 is fixed at the downstream side of the escape rail 54 in an inclined posture having the substantially same slope as that of the escape rail 54. The lower end portion of the fixed rail 165 is closed so that the fixed rail has a function for uniformly arranging the position of an IC slid down therein from the escape rail 54. The vacuum suction head 41 supported on and moved by the horizontal transporting means 40 is reciprocatingly rotated between the position shown by a solid line in the drawing and the position shown by a phantom line in the drawing as indicated by an arrow shown in the drawing in accordance with the rotation of the air cylinder 42 for linearly reciprocating the head 41 because the air cylinder 42 is pivotally mounted to the horizontal transporting means 40 through the arm 61 and the rotary type air cylinder 64 such that the air cylinder 42 can rotate within a predetermined angle between the solid line position and the phantom line position.

In the above construction, the horizontal transporting means 40 moves the vacuum suction head 41 to a position, for example, close to the downstream side of the fixed rail 165. At this position, the rotary type air cylinder 64 is driven to rotate the vacuum suction head 41 in counter-clockwise direction (upwardly) so that the tip surface (suction surface) of the vacuum suction head 41 comes to be in parallel with the package surface of the IC supported on the fixed rail 165. When the suction surface of the vacuum suction head 41 and the IC package surface run parallel with each other, the air cylinder 42 is driven to push out the vacuum suction head 41, thereby to attract the IC on the inclined fixed rail 165. After the vacuum suction head 41 has attracted the IC, the air cylinder 42 is driven again to retract the vacuum suction head 41 by a predetermined distance. Then the rotary type air cylinder 64 is driven to rotate the vacuum suction head 41 in clockwise direction, thereby to return the posture of the vacuum suction head 41 to vertical posture. As a result, the posture of the IC attracted against the vacuum suction head 41 is altered to horizontal posture.

In the state that the vacuum suction head 41 has attracted the IC of horizontal posture, the vacuum suction head 41 is moved in the horizontal direction by the horizontal transporting means 40 and is stopped at the predetermined position above the tray changing section 30. At this predetermined stopped position, the air cylinder 42 is driven to push out the vacuum suction head 41, thereby to release the IC from the vacuum suction head 41 to be dropped down into the test tray 31 being stopped at the tray changing section 30. Therefore, according to this embodiment, the posture alteration of an IC and the transportation of the IC to the test tray 31 can be done at the same time, and thus, the IC can efficiently be loaded onto the test tray 31. Other constructions and operations are the same as those in the second embodiment discussed above, and the explanations thereof are omitted.

Figure 8:
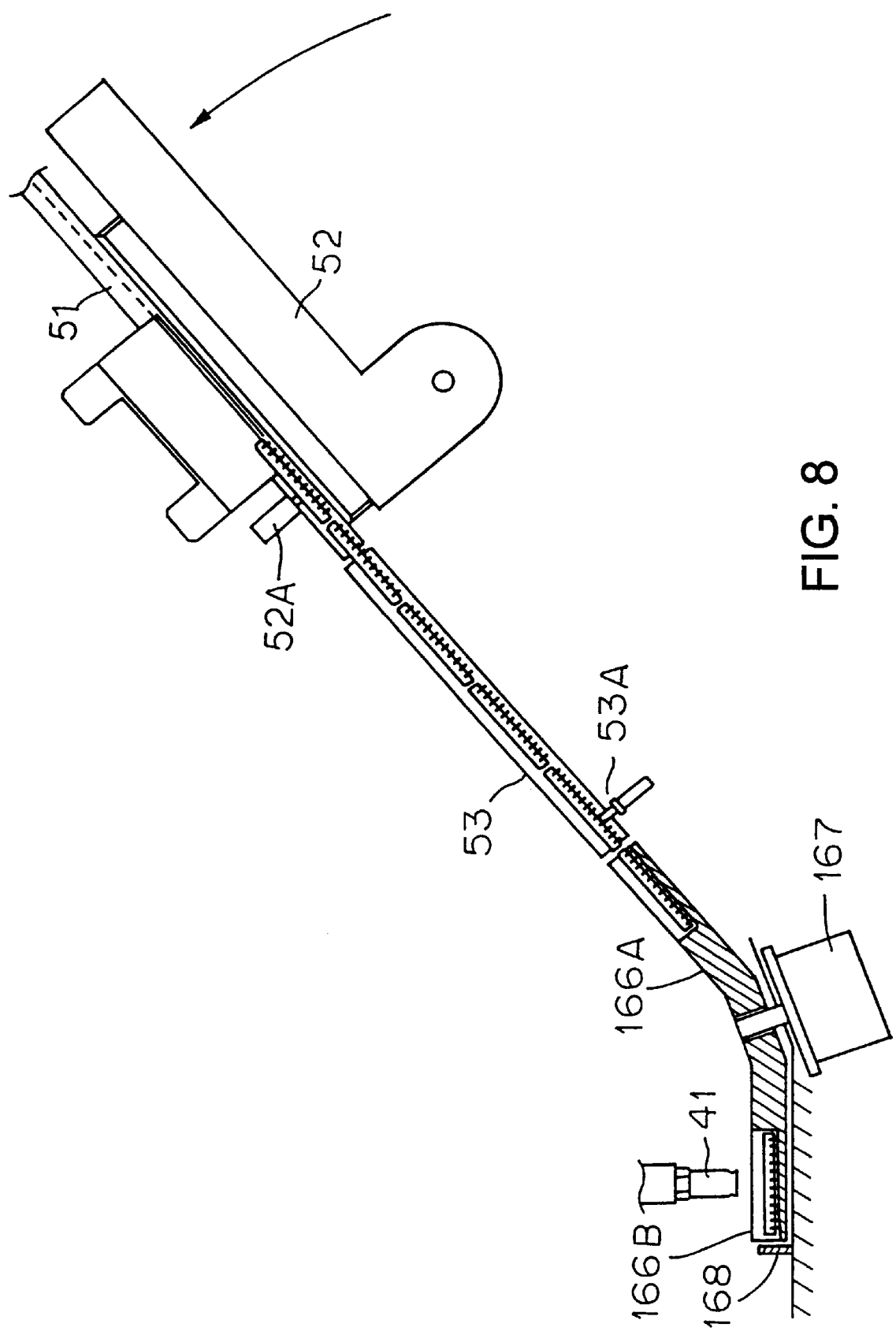
FIG. 8 is a side view showing in outline the construction of a sixth embodiment of the posture altering section according to the present invention.
Figure 9:
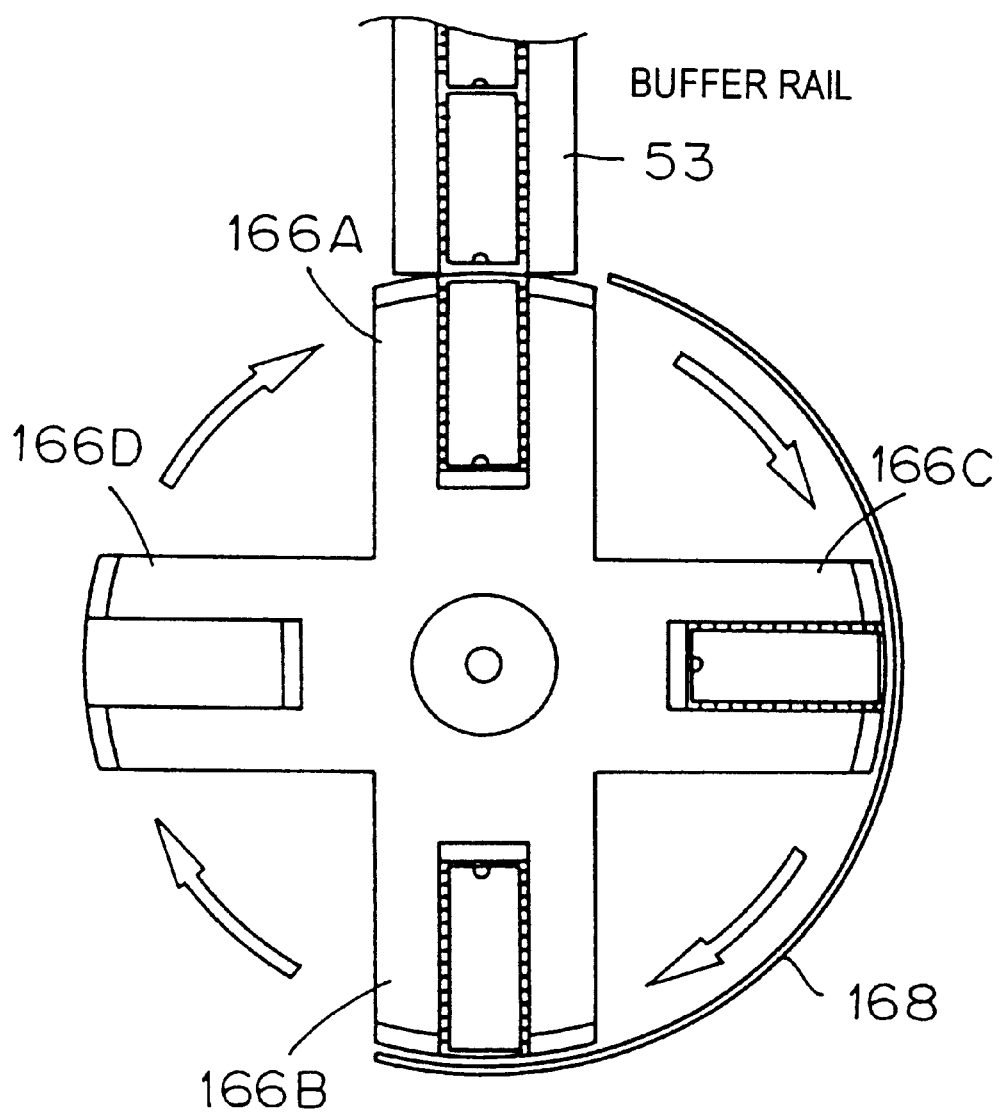
FIG. 9 is a plan view of FIG. 8 a portion of which is cut off.

FIGS. 8 and 9 show the construction of a sixth embodiment of the posture altering section according to the present invention. In this embodiment, the posture altering apparatus 160 comprises a posture altering rotator having substantially a cross-shape in plan view, and a pulse motor 167 for rotating the posture altering rotator by a predetermined angle (90° in this embodiment) at a time. The posture altering rotator has four (4) rotary arms 166A, 166B, 166C and 166D provided at angular intervals of 90° about its rotation axis as the center thereof and projecting externally in the diametric direction from the rotation axis as shown in FIG. 9. As shown in FIG. 8, rotary arms are given the same angle of upward inclination such that when one (166A in FIG. 8) of one pair of the rotary arms 166A and 166B or the other pair of the rotary arms 166C and 166D which are diametrically opposed to each other and angularly spaced apart by 180° about the rotation axis is aligned with the buffer rail 53 having the same angle of upward inclination as that of the one rotary arm, the other rotary arm (166B in FIG. 8) takes horizontal posture. That is, each rotary arm is given the same angle of upward inclination such that the inclination of one of a pair of diametrically opposed rotary arms is aligned with the extended line of the buffer rail 53 and the other rotary arm is held in horizontal posture. Therefore, in order to satisfy this condition or requirement, as shown in FIG. 8, the plane or surface of the main body of the posture altering rotator about the rotation axis is supported such that the plane of the main body rotates in an inclined state to horizontal plane.

Each of the rotary arms 166A, 166B, 166C and 166D has an IC receiving recess formed thereon for accommodating an IC to be tested therein. When each rotary arm is rotated to the position aligned with the buffer rail 53 by the pulse motor 167, an IC is slid down into the IC receiving recess of that rotary arm from the buffer rail 53. Thus, an IC can be accommodated in each rotary arm. At the position where each rotary arm has been rotated by 180° from the IC receiving position, the IC accommodated in the IC receiving recess takes horizontal posture, and hence it is possible to cause the IC to be attracted by the vacuum suction head 41 of the horizontal transporting means 40 (see FIG. 3). As a result, the IC can be transported to the test tray 31 by the horizontal transporting means 40. Further, a guide 168 is provided on a peripheral portion of the rotary arms 166A–166D for preventing the IC from bouncing out by a centrifugal force at the time when the posture altering rotator is rotating. Since any IC does not exist in the IC receiving recess of each rotary arm of the posture altering rotator after the IC has been attracted by the vacuum suction head 41 of the horizontal transporting means 40, as shown in FIG. 9, it suffices to provide the guide 168 only within the angular range of substantially 180° from a position in vicinity of the buffer rail 53 to a position where the IC takes horizontal posture and is attracted by the vacuum suction head 41 of the horizontal transporting means 40 in the rotational direction of the posture altering rotator.

In such a way, by using the rotary arms 166A–166D each having the same predetermined angle of inclination, it is possible to make the rotary arms 166A–166D have a function equivalent to the escape rail 54 in addition to the posture altering function. That is, if the length of the IC receiving recess formed on each of the rotary arms 166A–166D is selected to be equal to the length of one IC, only one movable stopper 53A may be provided on the buffer rail 53 for stopping the IC at the lowest position in the downstream side on the buffer rail 53. When the movable stopper 53A is moved downward to release the stopped IC, the IC is slid down into the IC receiving recess of the rotary arm positioned to oppose to the buffer rail 53. When the IC is stopped to slide down, the movable stopper 53A is restored to the original position, thereby preventing the IC at the lowest position in the downstream side on the buffer rail 53 from sliding down. In this state, by rotating the rotary arms by the pulse motor 167, the IC received in one rotary arm can be rotated. For example, even if the IC received in the rotary arm and the immediately following IC remaining on the buffer rail 53 should be mechanically coupled with each other (both the packages each accommodating the corresponding IC therein are coupled with each other by burrs, etc.), the mechanical coupling between them can be removed.

As described above, in accordance with the illustrated embodiment, the escape rail 54 provided for separating ICs one by one can be eliminated. Therefore, the time interval during which an IC moves through the escape rail 54 can be omitted. In addition, the construction of the apparatus is simplified. Moreover, since the posture altering apparatus is of a rotary type, the posture of an IC can be altered to a desired horizontal posture at high speed to transfer the IC to a test tray 31. Thus, the operation or work efficiency is improved.

Figure 10:
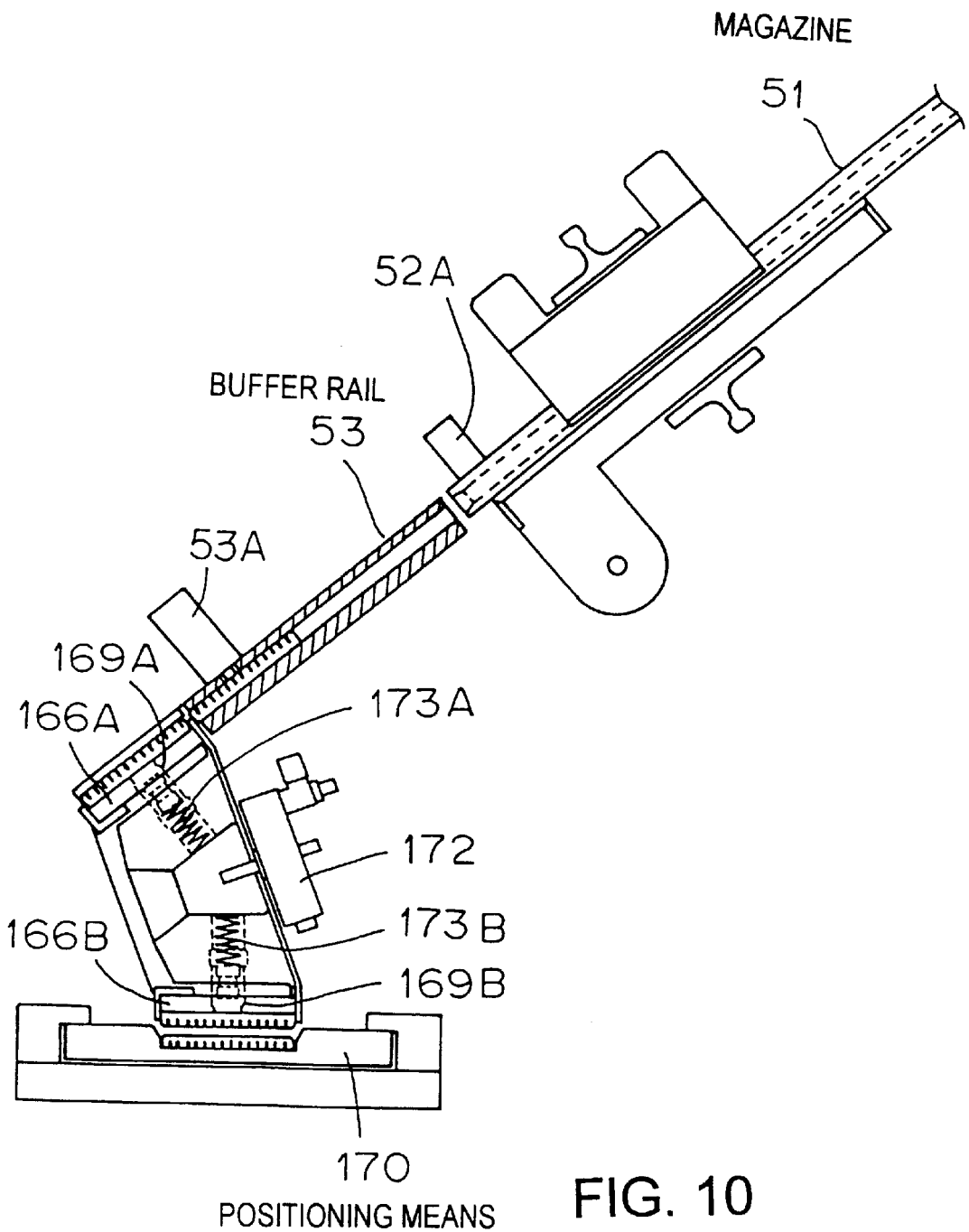
FIG. 10 is a side view showing in outline the construction of a seventh embodiment of the posture altering section according to the present invention.
Figure 11:
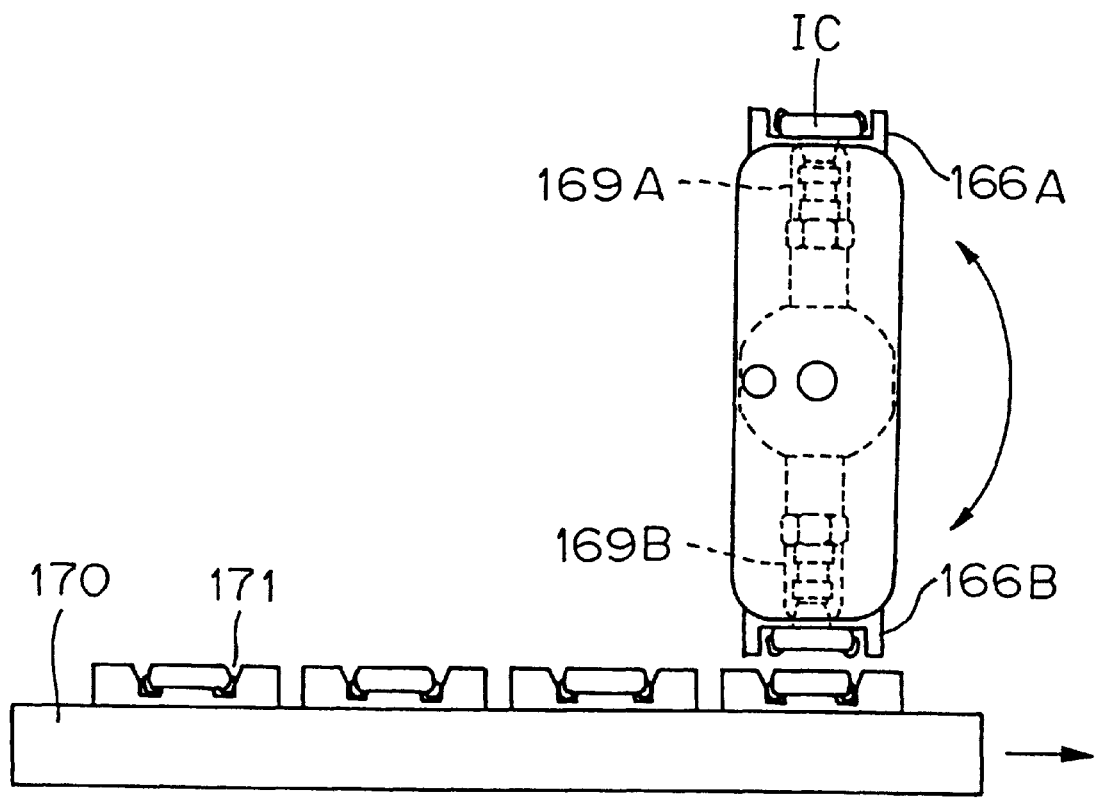
FIG. 11 is a right side view of FIG. 10 a portion of which is cut off.

FIGS. 10 and 11 show the construction of a seventh embodiment of the posture altering section according to the present invention. In this embodiment, the posture altering apparatus 160 comprises a posture altering rotator having substantially an isosceles trapezoidal shape (a trapezoid with equal legs), a positioning means 170 for receiving an IC the posture of which is altered to horizontal by this posture altering rotator and positioning the received IC in place, and a rotary type air cylinder 172 for reciprocatingly rotating the posture altering rotator within a predetermined angular range (180° in this embodiment). The posture altering rotator has a pair of rotary arms 166A and 166B mounted on the opposed legs (inclined surfaces) of the rotator. These rotary arms 166A and 166B have IC receiving portions for accommodating respective ICs therein formed thereon respectively along the respective legs (along the direction from the upper base of the trapezoid to the lower base thereof).

The opposed legs of the posture altering rotator, accordingly, a pair of the opposed rotary arms 166A and 166B rotate along a conical surface. Therefore, in this embodiment, the rotation axis of the posture altering rotator, accordingly, the rotation axis of the rotary arms 166A and 166B is positioned on a bisector dividing into two equal parts an angle that the angle of inclination of the magazine 51 makes with the horizontal plane, and each of the angles of inclination of the rotary arms 166A and 166B is set to half (½) of the angle that the inclined angle of the magazine 51 makes with the horizontal plane such that when the inclined surface of one rotary arm (166A in FIG. 10) is aligned with the extended line of the buffer rail 53, accordingly, the extended line of the magazine 51, the inclined surface of the other rotary arm (166B in FIG. 10) is held in horizontal posture. With this construction, as shown in FIG. 10, the rotary arm (166A) positioned at the upper side is aligned on the same straight line as the extended line of the magazine 51, and the other rotary arm (166B) is placed in a posture parallel to the horizontal plane at the lower side.

Moreover, in this embodiment, an IC is discharged from the magazine 51 with the terminal surface of the IC (the surface from which terminals of the IC are projecting) directed upward and the rear surface of the IC (the surface from which no terminals of the IC are projecting) directed downward, and is guided onto the IC receiving portion of the rotary arm 166A or 166B through the buffer rail 53. Vacuum suction heads 169A and 169B are mounted to the IC receiving portions of the rotary arms 166A and 166B respectively, and each of the vacuum suction heads attracts and holds the rear surface of the IC discharged into the IC receiving portion. With this structure, the IC is firmly held by the vacuum suction head and does not fly out externally during the time interval when the posture altering rotator is rotating.

In the state that each of the rotary arms 166A and 166B has attracted the IC, the rotary arms 166A and 166B are rotated by 180° by the rotational driving force of the rotary type air cylinder 172, thereby to alter the posture of the IC received with the rear surface down from the buffer rail 53 at the upper side into horizontal posture with the terminal surface down at the lower side. The positioning means 170 is located at the lower side to which the rotary arm having attracted the IC is rotated by 180°, and the IC the posture of which is altered into horizontal is held in a state that it is opposed to the positioning means 170 and spaced therefrom by a predetermined distance. In this state, the attracting force of the vacuum suction head (169B in the drawing) against which the IC is attracted is temporarily released, thereby to drop down the IC into the recess 171 of the positioning means 170.

The positioning means 170 has, as shown in FIG. 11, a plurality of recesses 171 formed in juxtaposed relation in the direction of the tangential line to the circle of revolution of the posture altering rotator and is supported such that it can move in the direction of the disposition of these recesses 171, accordingly, in the direction of the tangential line. Since the rotary arms 166A and 166B are reciprocatingly rotated by 180° the rotational driving force of the rotary type air cylinder 172, the ICs are alternately supplied to the recesses 171 of the positioning means 170 from the rotary arms 166A and 166B. Every time one IC is supplied to the positioning means 170, the positioning means 170 moves by a distance corresponding to the lateral length (width) of one recess 171 so that an empty recess is located at a position under the rotary arm 166A or 166B at which it arrives. When all the recesses 171 are filled with the ICs, the positioning means 170 moves to a position (not shown in the drawing) spaced apart from that position under the rotary arm 166A or 166B where the ICs are transferred to the horizontal transporting means 40 (see FIG. 3). The horizontal transporting means 40 transports the ICs transferred from the recesses 171 of the positioning means 170 to a test tray. Further, the reference characters 173A and 173B in FIG. 10 indicate hoses for connecting the vacuum suction heads 169A and 169B to a vacuum suction source, respectively. In the illustrated embodiment, the rotary arms 166A and 166B are reciprocatingly rotated by 180° by the rotational driving force of the rotary type air cylinder 172. However, the rotary arms 166A and 166B may be rotated by 180° in either direction by, for example, a stepping motor.

In this embodiment, the escape rail 54 provided for separating ICs one by one can be eliminated. Therefore, the time interval during which an IC moves through the escape rail 54 can be omitted. In addition, the construction of the apparatus is simplified. Moreover, since the posture altering apparatus is of a rotary type, the posture of an IC can be altered to a desired horizontal posture at high speed to transfer the IC to a test tray 31. Thus, the operation or work efficiency is improved.

Figure 12:
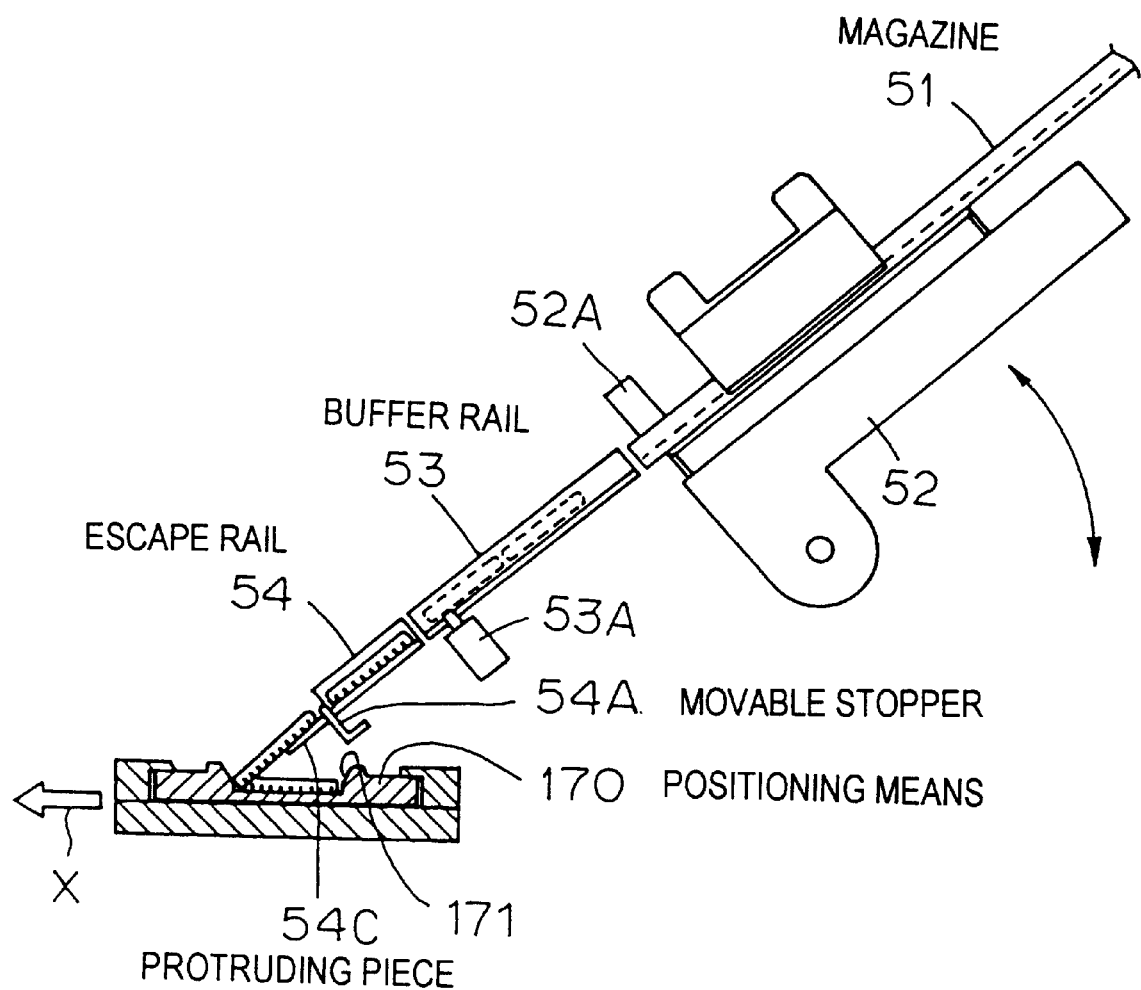
FIG. 12 is a side view showing in outline the construction of a eighth embodiment of the posture altering section according to the present invention.
Figure 13:
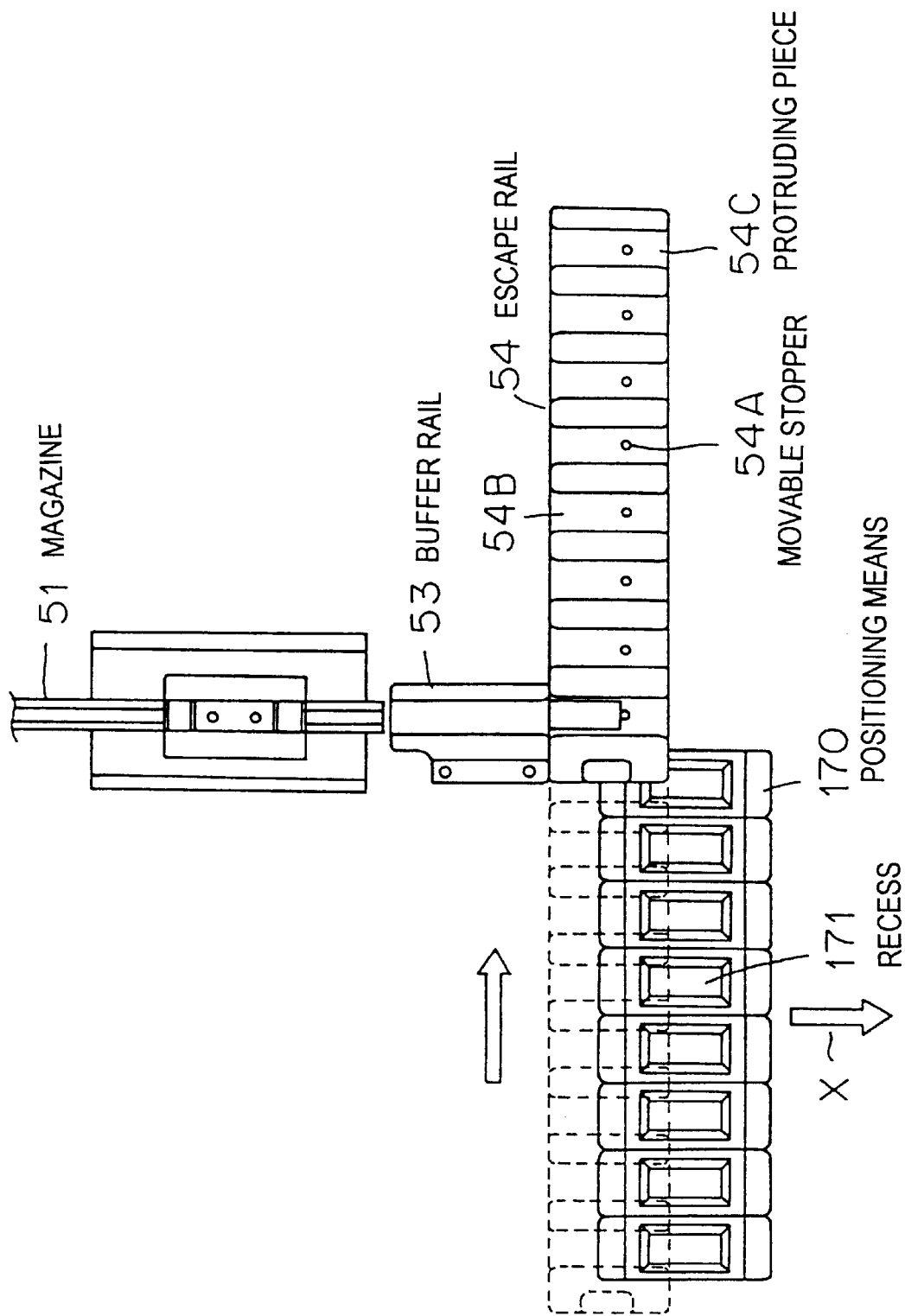
FIG. 13 is a plan view of FIG. 12 a portion of which is cut off.

FIGS. 12 and 13 show the construction of a eighth embodiment of the posture altering section according to the present invention. The illustrated eighth embodiment is the case where the posture altering apparatus 160 is constituted by a positioning means 170 for directly receiving the IC from the inclined escape rail 54 and for altering the posture of the IC into horizontal as well as for positioning the IC. In addition, in the eighth embodiment, the escape rail 54 has extended protruding pieces 54C jutting out from the movable stoppers 54A of the escape rail 54 toward the downstream side, respectively. That is, the IC received in the escape rail 54 from the buffer rail 53 is of an inclined posture. This IC of the inclined posture is dropped down into a recess 171 of the positioning means 170 with the posture thereof maintained as it is. In this case, the IC moves on the extended protruding piece 54C jutting out toward the downstream side of the movable stopper 54A of the escape rail 54 and then drops down into the recess 171 of the positioning means 170. Consequently, as shown in FIG. 12, when the front end of the IC reaches a positioning wall at the front side of the recess 171 of the positioning means 170, the rear end of the IC still remains on the extended protruding piece 54C. Therefore, in the state that the front end of the IC is in contact with the front side positioning wall of the recess 171, the positioning means 170 is moved in the direction of an arrow X shown in FIGS. 12 and 13, thereby to drop down the rear end side of the IC into the recess 171 from the extended protruding piece 54C of the movable stopper 54A. As a result, the IC is entirely dropped down into the recess 171, and thus, the posture of the IC is altered to horizontal and the IC is positioned by the recess 171.

In this embodiment, as shown in FIG. 13, on the escape rail 54 located at the downstream side of the buffer rail 53 are provided IC receiving grooves 54B capable of receiving eight ICs in juxtaposition with one another. Every time an IC is received in one of the IC receiving grooves 54B from the buffer rail 53, the escape rail 54 is moved laterally by one pitch (a distance corresponding to the interval between two adjacent grooves). When all of the IC receiving grooves 54B are filled with ICs, the escape rail 54 is moved above the positioning means 170 and the received ICs are dropped down one by one by sequentially pulling down the movable stoppers 54A provided in the respective IC receiving grooves. By this operation, as mentioned above, each of the ICs is dropped down in such posture that the forward end thereof will abut against the front side wall of the corresponding recess 171 of the positioning means 170 owing to the presence of the extended protruding piece 54C. When the forward end of the IC abuts against the front side wall of the corresponding recess 171, the rear end side of the IC is remaining on the extended protruding piece 54C, and hence the IC stops in the inclined posture (state shown in FIG. 12). In this state, on moving the positioning means 170 in the direction of the arrow X, the IC can completely be dropped down into the recess 171. Alternatively, the IC can completely be dropped down into the recess 171 if the escape rail 54 or the extended protruding piece 54C may be moved in the direction opposite to the direction of the arrow X instead of moving the positioning means 170 in the direction of the arrow X. After the positioning means 170 has been moved in the direction of the arrow X, the ICs in the recesses 171 are transported to a test tray by the horizontal transporting means not shown. Further, since the operation for transporting eight ICs at a time to the test tray from the positioning means 170 by the horizontal transporting means is the same as that in each embodiment previously discussed, the explanation thereof is omitted.

Figure 14:
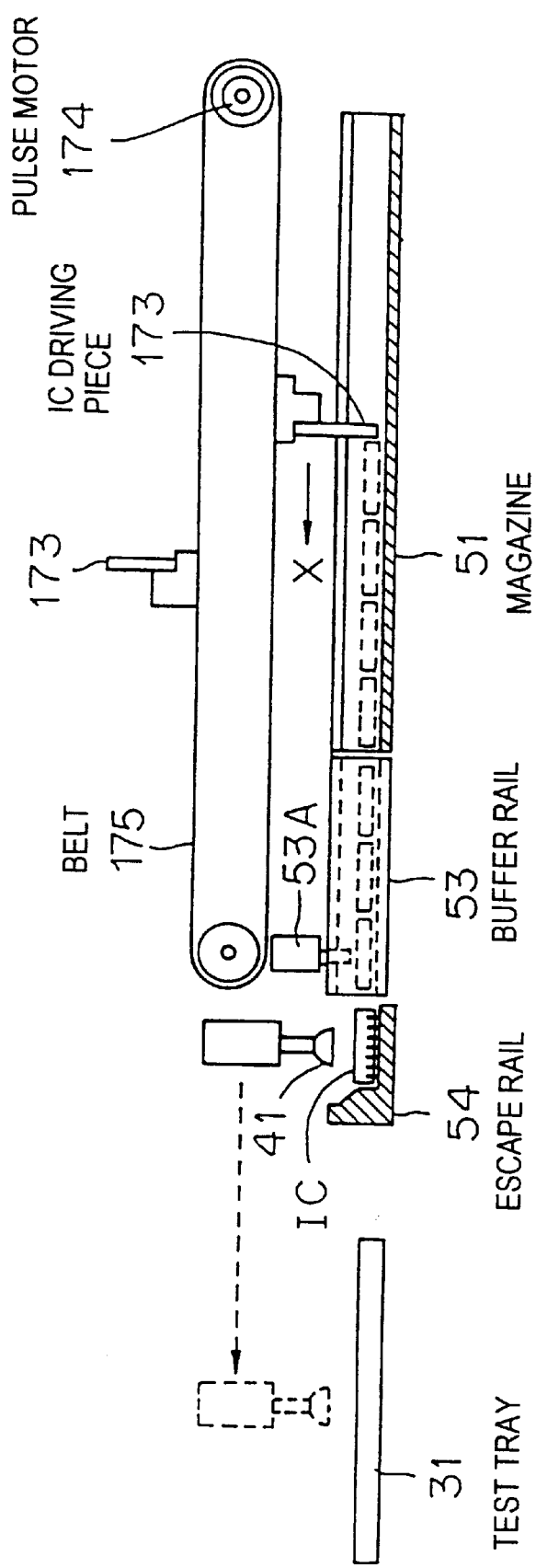
FIG. 14 is a side view showing in outline the construction of an embodiment of the IC take-out apparatus according to the present invention.

FIG. 14 shows the construction of an embodiment of the IC take-out apparatus according to the present invention. In the illustrated embodiment, the IC take-out apparatus is constructed such that it comprises two IC driving piece 173 each of which is adapted to be inserted into a magazine 51 placed in horizontal posture through a slit formed on the upper surface of the magazine 51 along the longitudinal direction thereof, and one of the IC driving pieces 173 inserted into the magazine 53 is moved in the direction of an arrow X, thereby to move the ICs in the magazine 51 in the direction of the arrow X, and thus the ICs are discharged from the magazine 51.

A buffer rail 53 is located at the forward end side of the magazine 51 and an escape rail 54 is placed at the exit side of the buffer rail 53. In addition, a movable stopper 53A is provided in the vicinity of the exit of the buffer rail 53 as usual, thereby to prevent the received ICs in the buffer rail 53 from discharging from the vicinity of the exit. As with the embodiments previously described, the escape rail 54 has a plurality of IC receiving portions laterally provided (in the direction orthogonal to the direction where an IC is fed into the escape rail 54 from the buffer rail 53) in juxtaposition with one another. The escape rail 54 moves laterally by a space corresponding to a lateral length (width) of one IC each time one IC is received therein. By this lateral movement of the escape rail 54, any mechanical engagement caused by burrs or the like between the received IC and the immediately following IC remaining on the buffer rail 53 can be removed. When an IC is fed into the escape rail 54 from the buffer rail 53, the IC abuts against the closed end of the escape rail 54, and hence the positions of ICs in the IC feeding direction are uniformly arranged by this closed end. As a result, in case that after eight (8) ICs have been received in the escape rail 54, for example, the escape rail 54 is moved to a predetermined position where the ICs received in the escape rail 54 are transferred to a test tray by attracting the ICs by the vacuum suction heads 41 of the horizontal transporting means, such operation can be smoothly and securely performed since the positions of all the ICs are already uniformly arranged.

In the illustrated example of FIG. 14, the IC driving pieces 173 are mounted to a belt 175 driven by a pulse motor 174. By intermittently driving the pulse motor 174, the ICs in the magazine 51 can be discharged one by one therefrom. In this embodiment, the two IC driving pieces 173 are supported by the belt 175 spaced nearly equal distance apart from each other. At the time point that all the ICs are discharged from the magazine 51 to the buffer rail 53, the emptied magazine 51 is exchanged for another one. At the timing that a new magazine 51 accommodating ICs therein is connected to the buffer rail 53 after the emptied magazine 51 has been removed, the other IC driving piece 173 mounted on the belt 175 enters into the slit of the new magazine 51. As a result, the discharge of the ICs from the new magazine 51 is started.

As described above, by applying the IC transporting apparatus and the IC posture altering apparatus according to the present invention to an IC handler, it is possible in the IC handler to alter ICs of an inclined posture supplied from an inclined magazine to horizontal posture and to transport them to a test tray. Consequently, ICs received in a rod-like magazine can be transported to a testing section of an IC tester by an IC handler adopting a horizontal transporting system. As a result, an IC tester of magazine/tray combination type can be constructed which allows both of ICs received in a magazine and in a tray each used as a container accommodating ICs therein to test them. Moreover, according to the present invention, since ICs are transported onto a test tray directly from the position where the IC posture is altered to horizontal by the posture altering apparatus, the time duration required to transport the ICs is reduced, and hence the time duration taken to test the ICs received in a magazine can be reduced as compared with the previously proposed IC handler of tray/magazine combination type. In addition, since the transporting mechanism between the posture altering means and the test tray can be simplified, the cost of the apparatus can be reduced.

Further, in each of the embodiments described above, there is described the case where ICs which are a typical example of semiconductor devices are taken out from a magazine, transported, and then the postures thereof are altered. However, it is needless to say that the present invention can also be applied to the case where other semiconductor devices other than an IC are taken out from a magazine, transported, and then the postures thereof are altered.

What is claimed is:

1. A semiconductor device posture altering apparatus comprising:

movable supporting means for supporting thereon a rod-like magazine accommodating semiconductor devices therein and for changing the rod-like magazine from a horizontal stationary posture to an inclined posture so that the semiconductor devices can slide down by their own weights;

buffer means having an inclined buffer rail for discharging the semiconductor devices accommodated in said magazine therefrom through the buffer rail by a natural sliding force of the semiconductor devices by their own weights in a serially aligned state one after another, said buffer means further comprising a movable stopper provided at a lower end portion of said buffer rail for functioning to keep or release the semiconductor device positioned at said lower end portion to be discharged from said buffer rail;

a posture altering rotator having a plurality of posture altering rails holding a semiconductor device and disposed at a downstream side of said buffer rail; and drive means for rotating said posture altering rotator between the inclined posture at which each of the posture altering rails is positioned one after another in alignment with the buffer rail and the horizontal posture, so that each of the semiconductor devices from the buffer rail is received in each of said posture altering rails in the inclined posture due to rotation of said posture altering rotator by said drive means, and the posture of each of the semiconductor devices thus received in each of the posture altering rails in the inclined posture is altered into the horizontal posture when said posture altering rotator is rotated to the horizontal posture;

whereby the semiconductor devices thus altered with their posture in the horizontal posture are picked up by a vacuum suction head and transported onto a test tray by horizontal transporting means.

2. The semiconductor device posture altering apparatus according to claim 1, wherein said posture altering rotator is located at the downstream side of said buffer rail and rotatable about its axis of rotation, said posture altering rotator has at least one pair of rotary arms diametrically opposed to each other, said pair of rotary arms are provided with the posture altering rails having the same angle of inclination given so that when one of said rotary arms is aligned with said buffer rail in the inclined posture, the other rotary arm is in the horizontal plane, a semiconductor device in the inclined posture discharged from said buffer rail is received in the one rotary arm coupled to the downstream side of said buffer rail in alignment therewith, and said drive means rotates said posture altering rotator such that the posture of the semiconductor device in the inclined posture held by the posture altering rail of on the one rotary arm is altered to horizontal posture by revolution of that rotary arm by 180°, whereby said vacuum suction head attracts the semiconductor device in the horizontal posture on one rotary arm when said vacuum suction head locates at a location above said one rotary arm in the horizontal posture.

3. The semiconductor device posture altering apparatus according to claim 1, wherein said posture altering rotator located at the downstream side of said buffer rail and rotatable about its axis of rotation positioned on a bisector dividing into two equal parts an angle that the axis of said magazine and said buffer rail makes with a horizontal plane, said posture altering rotator has a pair of rotary arms diametrically opposed to each other, each of said pair of rotary arms is provided with each of the posture altering rails having the same angle of inclination given so that when one of said rotary arms is aligned with said buffer rail in the inclined posture, the other rotary arm is placed in a posture parallel to the horizontal plane, each of the rotary arms is further provided with device attracting suction means for attracting, when a semiconductor device in the inclined posture discharged from said buffer rail is received in the posture altering rail of one rotary arm coupled to the lower end portion of said buffer rail in alignment therewith, inner side of this semiconductor device to thereby hold the same in the posture altering rail, and said drive means rotates said posture altering rotator such that the posture of the semiconductor device in the inclined posture attracted by the device attracting suction means is altered to the horizontal posture by revolution of that rotary arm by 180°, and said semiconductor device posture altering apparatus further comprising positioning means provided underneath the semiconductor device held in the posture altering rail by the device attracting suction means in the horizontal posture for receiving the semiconductor device released from said device attracting suction means with the horizontal posture held and defining the position of receiving the semiconductor device.

* * * * *

UNITED STATES PATENT AND TRADEMARK OFFICE
CERTIFICATE OF CORRECTION

PATENT NO.:      6,135,699
DATED      :     October 24, 2000
INVENTOR(S):     Yutaka WATANABE, et al.

It is certified that errors appear in the above-identified patent and that said Letters Patent is hereby corrected as shown below:

ON THE TITLE PAGE
[75]   fourth line, change "Gumma" to --Osura--.

Column 22,
    line 29, change "," to --;--.

Signed and Sealed this

Eighth Day of May, 2001

*Attest:*

NICHOLAS P. GODICI

*Attesting Officer*    Acting Director of the United States Patent and Trademark Office

UNITED STATES PATENT AND TRADEMARK OFFICE
CERTIFICATE OF CORRECTION

PATENT NO.:   6,135,699
DATED      :   October 24, 2000
INVENTOR(S):  Yutaka et al.

It is certified that errors appears in the above-identified patent and that said Letters Patent is hereby corrected as shown below:

On the title page: Item
[75]   fourth line, change "Gumma" to --Oura-gun--.

Column 22,
    line 29, change "," to --;--.

Signed and Sealed this

Fifteenth Day of May, 2001

*Attest:*

NICHOLAS P. GODICI

*Attesting Officer*    *Acting Director of the United States Patent and Trademark Office*